(12) United States Patent
Giaquinta et al.

(10) Patent No.: US 7,166,470 B2
(45) Date of Patent: Jan. 23, 2007

(54) FORMATION OF COMBINATORIAL ARRAYS OF MATERIALS USING SOLUTION-BASED METHODOLOGIES

(75) Inventors: Daniel M. Giaquinta, Mountain View, CA (US); Martin Devenney, Mountain View, CA (US); Keith A. Hall, San Jose, CA (US); Isy Goldwasser, Palo Alto, CA (US)

(73) Assignee: Symyx Technologies, Inc., Santa Clara, CA (US)

(*) Notice: Subject to any disclaimer, the term of this patent is extended or adjusted under 35 U.S.C. 154(b) by 265 days.

(21) Appl. No.: 10/336,605

(22) Filed: Jan. 3, 2003

(65) Prior Publication Data
US 2003/0219906 A1 Nov. 27, 2003

Related U.S. Application Data

(63) Continuation of application No. 10/198,709, filed on Jul. 17, 2002, now abandoned, which is a continuation of application No. 09/156,827, filed on Sep. 18, 1998, now abandoned, and a continuation-in-part of application No. 09/019,425, filed on Feb. 5, 1998, now Pat. No. 6,013,199, which is a continuation-in-part of application No. 08/327,513, filed on Oct. 18, 1994, now Pat. No. 5,985,356.

(60) Provisional application No. 60/090,380, filed on Jun. 23, 1998.

(51) Int. Cl.
*C40B 30/08* (2006.01)
*C40B 50/00* (2006.01)
*C40B 50/04* (2006.01)
*C40B 40/16* (2006.01)
*C40B 40/18* (2006.01)
*C40B 60/08* (2006.01)

(52) U.S. Cl. .................. 436/37; 436/43; 436/73; 436/76; 436/100; 436/127; 435/DIG. 30; 435/DIG. 31; 435/DIG. 32; 435/DIG. 33; 435/DIG. 46

(58) Field of Classification Search .............. 435/4, 435/DIG. 1, 2, 9, 11, 12, 13, 22, 29, DIG. 30, 435/DIG. 31, DIG. 32, DIG. 33, DIG. 40, 435/DIG. 46, DIG. 49; 436/73, 76, 77, 79, 436/80, 81, 82, 83, 84, 85, 100, 127, 133, 436/134, 139
See application file for complete search history.

(56) References Cited

U.S. PATENT DOCUMENTS

| | | | |
|---|---|---|---|
| 3,856,404 A | 12/1974 | Hershier et al. | |
| 4,250,346 A * | 2/1981 | Young et al. | 585/658 |
| 4,680,243 A | 7/1987 | Shimkunas et al. | |
| 4,797,259 A | 1/1989 | Matkovich et al. | |
| 4,851,150 A | 7/1989 | Hench et al. | |
| 4,931,312 A | 6/1990 | De Leeuw et al. | |
| 5,292,553 A | 3/1994 | Leture et al. | |
| 5,356,756 A | 10/1994 | Cavicchi et al. | |
| 5,391,213 A | 2/1995 | Frovel | |
| 5,416,613 A | 5/1995 | Rolleston et al. | |
| 5,423,285 A | 6/1995 | Paz de Arujo et al. | |
| 5,456,945 A | 10/1995 | McMillan et al. | |
| 5,514,822 A | 5/1996 | Scott et al. | |
| 5,559,260 A | 9/1996 | Scott et al. | |
| 5,585,136 A | 12/1996 | Barrow et al. | |
| 5,612,082 A | 3/1997 | Azuma et al. | |
| 5,654,456 A | 8/1997 | Scott et al. | |
| 5,656,329 A | 8/1997 | Hampden-Smith et al. | |
| 5,690,727 A | 11/1997 | Azuma et al. | |
| 5,803,961 A | 9/1998 | Azuma et al. | |
| 5,959,297 A | 9/1999 | Weinberg et al. | |
| 5,985,356 A | 11/1999 | Schultz et al. | |
| 6,004,617 A | 12/1999 | Schultz et al. | |
| 6,013,199 A | 1/2000 | McFarland et al. | |
| 6,015,880 A | 1/2000 | Baldeschwieler et al. | |
| 6,030,917 A | 2/2000 | Weinberg et al. | |
| 6,284,402 B1 * | 9/2001 | Mallouk et al. | 429/40 |
| 6,326,090 B1 | 12/2001 | Schultz et al. | |
| 6,395,552 B1 | 5/2002 | Borade et al. | |
| 6,410,331 B1 | 6/2002 | Schultz et al. | |
| 6,514,764 B1 | 2/2003 | Willson, III | |
| 6,541,271 B1 | 4/2003 | McFarland et al. | |
| 6,720,186 B1 * | 4/2004 | Turner et al. | 436/37 |

FOREIGN PATENT DOCUMENTS

FR 2743555 7/1997

(Continued)

OTHER PUBLICATIONS

Reddington et al., "Combinatorial Electrochemistry: A Highly Parallel, Optical Screening Method for Discovery of Better Electrocatalysts", Jun. 12, 1998, Science, vol. 280, Issue 5370, pp. 1735-1737.*

(Continued)

*Primary Examiner*—Peter Paras, Jr.
*Assistant Examiner*—My-Chau T Tran

(57) ABSTRACT

A combinatorial method for discovering or optimizing materials is disclosed. The method uses solution-based components that are mixed and dispensed into regions on a substrate for drying and/or heat-treating. The drying and/or heat-treating produces materials that can be tested for a desired property.

20 Claims, 1 Drawing Sheet

FOREIGN PATENT DOCUMENTS

| GB | 1022399 | 3/1966 |
|---|---|---|
| JP | 49066544 | 6/1974 |
| JP | 06096736 | 4/1994 |
| JP | 06236733 | 8/1994 |
| WO | WO 96/11878 | 4/1996 |
| WO | WO 97/32208 A1 | 9/1997 |
| WO | WO 98/15501 | 4/1998 |
| WO | WO 99/59716 | 11/1999 |

OTHER PUBLICATIONS

Briceno et al., "A class of cobalt oxide magnetoresistance materials discovered with combinatorial synthesis", Oct. 13, 1995, Science, vol. 270, Iss.5234 , pp. 273-275.*

Balakrishnan et al., "Preparation of Bimetallic Pt-Sn/Alumina Catalysts by the Sol-Gel Method", Jul. 1994, Langmuir, vol. 10, No. 7, pp. 2487-2490.*

Copending U.S. Appl. No. 10/404,636, filed Apr. 1, 2003.

Akporiaye et al. (1998). "Combinatorial Approach to the Hydrothermal Synthesis of Zeolites," *Angew. Chem. Int. Ed.* 37(5):609-611.

Baker et al. (1996). "Solution-Based Assembly of Metal Surfaces by Combinatorial Methods," *J. Am. Chem. Soc.* 118:8721-8722.

Boguár, J. (1963). Method for the Quantitative Evaluation of Catalytic Reactions: The Simultaneous Comparison Method, *Mikrochim. Ichnoanal. Acta* 801-828.(Translation).

Briceno et al. (1995). "A Class of Cobalt Oxide Magnetoresistance Materials Discovered with Combinatorial Synthesis," *Science* 270:273-275.

Bukeikhanova, S. et al. (1998). "AMM-$In_x$Si, a Microporous Catalyst for the Oxidative Dimerization of Propene with Air," *Catalyst Letters* 50:93-105.

Corriu, R.J.P. et al. (1996). "Recent Development of Molecular Chemistry for Sol-Gel Processes," *Angew. Chem. Int. Ed. Engl.* 35:1420-1436.

Danielson, E. et al. (1998). "A Rare-Earth Phosphor Containing One-Dimensional Chains Identified Through Combinatorial Methods," *Science. U.S.A. Association for the Advancement of Science* 6 Feb. 1998 pp. 837-839.

Hanak. (1969) "A Step Toward Automation of Materials Research," *RCA Technical Report* (Apr. 3, 1969).

Hanak. (1970). "The 'Multiple-Sample Concept' in Materials Research: Synthesis, Compositional Analysis and Testing of Entire Multicomponent Systems," *J. Mat. Sci.* 5:964-971.

Hanak, J.J. (1973) "Calculation of composition of dilute cosputtered multicomponent films," *J. Appl. Phys.* 44(11)5142-5147.

Hanak, J.J. (1971). "Compositional determination of rf co-sputtered multicomponent systems," *The Journal of Vacuum Science and Technology* 8(1)172-175.

Hanak, J.J. (1974). "Electroluminescence in ZnS : $Mn_x$: $Cu_y$ rf-sputtered films," *Japan J. Appl. Phys.*, Suppl. 2, Pt. 1:809-812.

Hanak, J.J. et al. (1970). "Radio-frequency-sputtered films of $_\beta$-tungsten structure compounds," *Journal of Allied Physics* 41(12)4958-4962.

Hanak, J.J., et al. (1969). "The effect of grain size on the superconducting transition temperature of the transition metals," *Physics Letters* 30A(3)201-202.

Hench, L.L. et al. (1986). "The Role of CHemical Additives in Sol-Gel Processing," *Mat. Res. Soc. Symp. Proc.* 73:35-47.

Hench, L.L. et al. (1990). "The Sol-Gel Process," *Chem. Review* 90:33-72.

Hill et al. (1996). "The First Combinatorially Prepared and Evaluated Inorganic Catalysts. Polyoxometalates for the Aerobic Oxidation of the Mustard Analog Tetrahydrothiopheve (THT)," *J. Mol. Catalysis A: Chem.* 114:103-111.

Holzwarth et al. (1998). "Detection of Catalytic Activity in Combinatorial Libraries of Heterogeneous Catalysts by IR Thermography," *Ange. Chem. Int. Ed.* 37(19):2644-2647.

Klein et al. (1998). "Combinatorial Material Libraries on the Microgram Scale with an Example of Hydrothermal Synthesis," *Angew. Chem. Int. Ed.* 37(24):3369-3372.

Klein, S. et al. (1996). "Amorphous Microporous Titania-Silica Mixed Oxides: Preparation, Characterization, and Catalytic Redox Properties," *J. Catalysis* 163:476-488.

Levy, D. et al. (1995). "Sol-Gel Processing of Optical and Electrooptical Materials," *Advanced Materials* 7(2):120-129.

Livage, L. et al. (1988). "Sol-Gel Chemistry of Transition Metal Oxides," *Prog. Solid St. Chem* 18:259-341.

Mehrotra, R.C. (1988). "Polymetallic Alkoxides—Precursors for Ceramics," *Mat. Res. Soc. Smp. Proc.* 121:81-92.

Ostresh et al. (1994). *Biopolymers* 34:1681-1689.

Peshev and Slovova (1994). "Preparation of La-Aluminate Thin Films . . . ," *Materials Research Bulletin* 29(3):255-261.

Peshev, P. et al. (1994). "Preparation of Lanthanum Aluminate Thin Films by a Sol-Gel Procedure Using Alkoxide Precursors," *Materials Research Bulletin* 29(3):255-261.

Ravichandran, D. et al. (1997). "Fabrication of $Y_3AL_5O_{12}$: Eu Thin Films and Powders for Field Emission Display Applications," *J. Luminescence* 71:291-297.

Schardt et al. (1994). "Cofired AIN Pad Grid . . . ," *Int. J. of Microcircuits and Electornic Packaging* 17(3):272-279.

Schwartz, R. (1997). "Chemical Solution Deposition of Perovskite Thin Films," *Chem. Mater.* 9:2325-2340.

Segal, D. (1997). "Chemical Synthesis of Ceramic Materials," *J. Mater. Chem.* 7(8):1297-1305.

Selvaraj et al. (1991). "Sol-Gel Thin Film . . . ," *Mater. Lett* 12(5):311-315.

Stork, S. et al. (1997). "Amorphous Sn/Si Mixed Oxides, Mild Solid Lewis Acid Catalysts for Esterification Reactions," *J. Catalysis* 172:414-426.

Sun et al. (1997). "Solution-Phase Synthesis of Luminescent Material Libraries," *Adv. Mater* 9(13):1046-1049.

Uekawa, N. et al. (1995). "Transition Metal Oxide Films," *Advanced Materials* 7(3):312-315.

Van Dover et al. (1998). "Discovery of a Useful Thin-Film Dielectric Using a Composition-Spread Approach," *Nature* 392:162-164.

Wu, X.D. et al. (1997). *Vacuum Solutions* Novemer.

Xiang et al. (1995). "A Combinatorial Approach to Materials Discovery," *Science* 268:1738-1740.

Balkenhohl et al., "Combinatorial Synthesis of Small Organic Molecules", Angew. Chem. Int. Ed. Engl., 1996, pp. 2288-2337, vol. 35.

Brinker et al., "Sol-Gel Science: The Physics and Chemistry of Sol-Gel Processing", 1989.

Danielson et al., "A Combinatorial Approach to the Discovery and Optimization of Luminescent Materials", Nature, Oct. 30, 1997, pp. 944-948, vol. 389.

McFarland et al., "Approaches for Rapid Materials Discovery Using Combinatorial Methods", Mat. Tech., 1998, pp. 107-120, vol. 13, No. 3.

Reddington et al., "Combinatorial Electrochemistry: A Highly Parallel, Optical Screening Method for Discovery of Better Electrocatalysts", Science, Jun. 12, 1998, pp. 1735-1737, vol. 280.

* cited by examiner

FORMATION OF COMBINATORIAL ARRAYS OF MATERIALS USING SOLUTION-BASED METHODOLOGIES

The present application is a continuation of U.S. patent application Ser. No. 10/198,709 filed Jul. 17, 2002 now abandoned which itself is a continuation application of Ser. No. 09/156,827 filed Sep. 18, 1998 now abandoned which itself is a continuation-in-part application of Ser. No. 08/327,513 filed Oct. 18, 1994 (now issued U.S. Pat. No. 5,985,356) and a continuation-in-part application of Ser. No. 09/019,425 filed Feb. 5, 1998 (now issued as U.S. Pat. No. 6,013,199) and which claims the benefit of Ser. No. 60/090,380 filed Jun. 23, 1998.

FIELD OF THE INVENTION

The present invention generally relates to methods for the creation of an array of materials at known locations on a substrate surface. The invention may be applied to prepare materials such as inorganic materials, ceramic materials and composite materials (e.g., inorganic composites, organic composites, or combinations thereof), etc. Once prepared, these materials can be screened in parallel or sequentially for useful properties. More specifically, the present invention relates to a process for making combinatorial libraries of materials by solution-based processes, such as the sol-gel process or the metal organic decomposition process. In addition, this invention relates to a general solution-based method for making virtually any metal oxide, including metal-oxides that are a single phase and multi-component metal-oxide containing systems.

BACKGROUND OF THE INVENTION

The discovery of new materials with novel chemical and physical properties often leads to the development of new and useful technologies. Over forty years ago, for example, the preparation of single crystal semiconductors transformed the electronics industry. Currently, there is a tremendous amount of activity being carried out in the areas of catalysis, superconductivity, magnetic materials, phosphors, nonlinear optics and high strength materials. Unfortunately, even though the chemistry of extended solids has been extensively explored, few general principles have emerged that allow one to predict with certainty composition, structure and reaction pathways for the synthesis of such solid state compounds, compositions or structures. Moreover, it is difficult to predict a priori the physical properties a particular three-dimensional structure will possess.

Clearly, the preparation of new materials with novel chemical and physical properties is at best happenstance with our current level of understanding. Consequently, the discovery of new materials depends largely on the ability to synthesize and analyze new materials, compounds, compositions or structures. Given approximately 100 elements in the periodic table that can be used to make such compositions consisting of three, four, five, six or more elements, the universe of possible new compounds remains largely unexplored. As such, there exists a need in the art for a more efficient, economical and systematic approach for the synthesis of possibly new compounds, compositions or structures (e.g., materials) and for the screening of such materials for useful properties.

One of the processes whereby nature produces molecules having novel functions involves the generation of large collections (libraries) of molecules and the systematic screening of those libraries for molecules having a desired property. An example of such a process is the humoral immune system which in a matter of weeks sorts through some $10^{12}$ antibody molecules to find one which specifically binds a foreign pathogen (Nisonoff, et al., *The Antibody Molecule* (Academic Press, New York, 1975)). This notion of generating and screening large libraries of molecules has been applied to the drug discovery process. The discovery of new drugs can be likened to the process of finding a key that fits a lock of unknown structure. One solution to the problem is to simply produce and test a large number of different keys in the hope that one will fit the lock.

Using this logic, methods have been developed for the synthesis and screening of large libraries (up to $10^{14}$ molecules) of peptides, oligonucleotides and other small molecules. Geysen, et al., for example, have developed a method wherein peptide syntheses are carried out in parallel on several rods or pins (see, *J. Immun. Meth.* 102:259–274 (1987), incorporated herein by reference for all purposes). Generally, the Geysen, et al. method involves functionalizing the termini of polymeric rods and sequentially immersing the termini in solutions of individual amino acids. In addition to the Geysen, et al. method, techniques have recently been introduced for synthesizing large arrays of different peptides and other polymers on solid surfaces. Pirrung, et al., have developed a technique for generating arrays of peptides and other molecules using, for example, light-directed, spatially-addressable synthesis techniques (see, U.S. Pat. No. 5,143,854 and PCT Publication No. WO 90/15070, incorporated herein by reference for all purposes). In addition, Fodor, et al. have developed, among other things, a method of gathering fluorescence intensity data, various photosensitive protecting groups, masking techniques, and automated techniques for performing light-directed, spatially-addressable synthesis techniques (see, Fodor, et al., PCT Publication No. WO 92/10092, 15 the teachings of which are incorporated herein by reference for all purposes). Despite these advances, most of the combinatorial work heretofore has focused on solid state-synthesis of materials. See also, e.g., U.S. Pat. Nos. 5,288,514 and 5,424,186.

Solution-based methods, such as the sol-gel process, are widely used for the synthesis of inorganic materials. One of the inherent advantages of the solution process for inorganic materials, as opposed to solid-state synthesis methodologies, is that diffusion distances are shortened due to the more intimate mixing that the solution offers. The solution-based methodologies usually result in a reduction in processing temperatures. Possibly, solution-based methodologies provide access to kinetically stable phases that might not otherwise be prepared through solid-state synthesis methodologies. Thus, a need exists for using a solution-based method for the synthesis of inorganic and other solid state materials.

This invention provides methods for the synthesis of combinatorial libraries or arrays on or in suitable substrates by effectively utilizing solution-based techniques. The invention can be used to make known materials or new materials. In addition, this invention provides a general route for the synthesis of transition metal and other oxides.

SUMMARY OF THE INVENTION

In one aspect, this invention provides a method for forming an array of materials by first at least partially dissolving two or more starting components in a common or compatible solvent(s). The two or more components typically are mixed together in nine or more different ratios to form nine or more different mixtures. The nine or more mixtures are then dispensed into individual regions on a substrate, and thereafter dried and/or heat treated to form the array. Typically, each different ratio of components results in a different material, meaning that nine or more different materials are typically formed in the array. Materials that can be prepared using the methods of the present invention include, for example, covalent network solids, ionic solids and molecular solids. More particularly, materials which can be prepared include inorganic materials, intermetallic materials, metal alloys, ceramic materials, composite materials (e.g., inorganic composites, organic composites, or combinations thereof), etc. Once prepared, these materials can be screened for useful properties including, for example, electrical, thermal, mechanical, morphological, optical, magnetic, chemical and other properties.

In another aspect, a first component of a first material is delivered to a first region on a substrate, and a first component of a second material is delivered to a second region on the same substrate. Simultaneously or thereafter, a second component of the first material is delivered to the first region on the substrate, and a second component of the second material is delivered to the second region on the substrate. The process is optionally repeated, with additional components, to form an array of components at predefined, i.e., known locations on the substrate. Thereafter, the components are dried and/or heat-treated to form the array.

In general, starting components include alkoxides, aryloxides, allyloxides, diketonates, oxoalkoxides, oxoaryloxides, oxodiketonates, phosphates, phosphines, sulfates, nitrites, nitrates, hydroxides, amines, amides, imides, carbonates, carbonyls, halides, oxyhalides, metals, carboxylates and the like. Typically, these starting components also include a source of a metal or metalloid atom. Modifying ligands or stabilizers may be added to the components or component mixtures. The nature and concentration of the modifying ligands or stabilizers will depend on the component(s) or component mixtures. A drying agent may also be added to the mixtures to aid in homogeneous drying. The addition of the drying agent may necessitate the addition of one or more stabilizers. The components, stabilizers and other agents can be sequentially or simultaneously delivered to predefined regions on or in the substrate in any stoichiometry, including a gradient of stoichiometries. Arrays prepared with the methods of this invention can contain the same or different materials in each region, depending on the desired use for the array (e.g., discovering new materials or optimizing or repeated testing on a single material). The various components can be deposited into the regions from a dispenser. Also, generally, the drying and/or heating steps can take place in a desired atmosphere, including an atmosphere that provides different atoms to the material, such as a sulfur-containing atmosphere that would provide sulfur to the material being made.

The invention offers general solubility of components leading to a high level of mixing, high purity and a reduction in processing temperature. The versatility of this invention will be appreciated by those of skill in the art upon review of this specification.

DETAILED DESCRIPTION OF THE INVENTION

Figure 1:
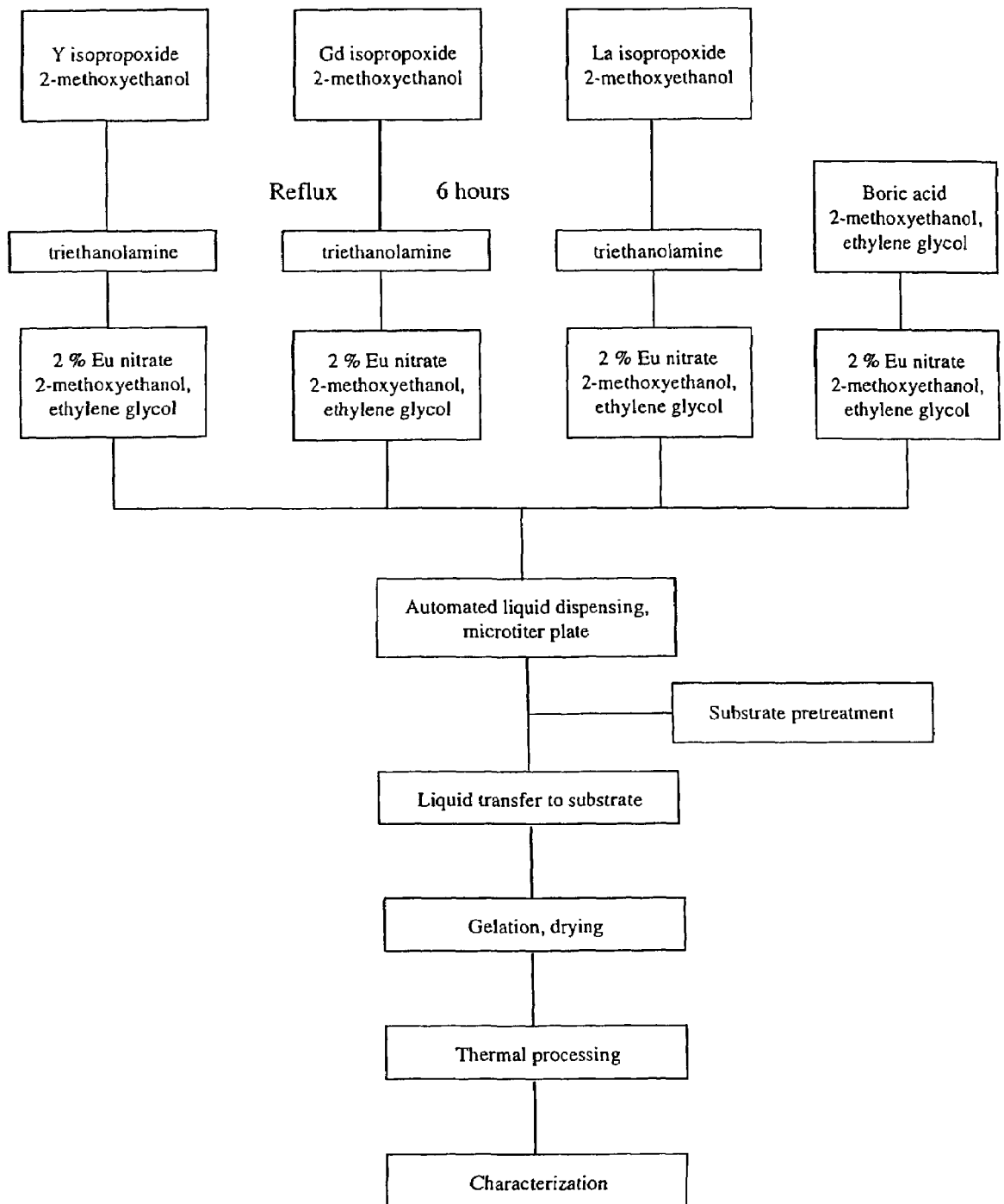
FIG. 1 is a flow chart of the methodology used to form the array materials in Example 1; however, this flow chart is generally applicable to show one methodology of this invention.

The following terms are intended to have the following general meanings as they are used herein:

Substrate: A material having a rigid or semi-rigid surface. In many embodiments, at least one surface of the substrate will be substantially flat, although in some embodiments it may be desirable to physically separate regions for different materials with, for example, dimples, wells, raised regions, etched trenches, or the like. In some embodiments, the substrate itself contains wells, raised regions, etched trenches, etc., which form all or part of the regions (for example a microtiter plate).

Predefined Region: A predefined region is a localized area on a substrate which is, was, or is intended to be used for formation of a selected material and is otherwise referred to herein in the alternative as a "known" region, "reaction" region, "selected" region, "individual" region, or simply a "region." The predefined region may have any convenient shape, e.g., circular, rectangular, elliptical, wedge-shaped, etc. A predefined region and, therefore in some embodiments, the area upon which each distinct material is synthesized is smaller than about 25 cm$^2$, preferably less than 10 cm$^2$, more preferably less than 5 cm$^2$, even more preferably less than 1 cm$^2$, still more preferably less than 1 mm$^2$, and even more preferably less than 0.5 mm$^2$. In most preferred embodiments, the regions have an area less than about 10,000 μm$^2$, preferably less than 1,000 μm$^2$, more preferably less than 100 μm$^2$, and even more preferably less than 10 μm$^2$. Also, the regions are separated from each other so that a material in a first region cannot interdiffuse with a material in a second region and thus the regions have a minimum size. This separation can be accomplished in many ways, which are discussed below.

Component: "Component" is used herein to refer to chemical substances that act upon one another to produce a particular material and are otherwise referred to herein in the alternative as "reactant" or "reactant component."

Component Mixture: The term "component mixture" is used herein to refer to a mixture of two or more components in a single vessel, with or without stabilizers or other agents added. For example, a first component may be dissolved in a first vessel. A second component can be added resulting in a "component mixture" in the first vessel. In a second vessel, a third component may be dissolved. If the contents of the first vessel and second vessel are mixed, a "component mixture" is formed comprising the first, second and third components.

Material: The term "material" is used herein to refer to solid-state compounds, extended solids, extended solutions, clusters of molecules or atoms, crystals, etc. In general, a material is formed from a mixture of two or more components. Also in general, a material is contained within a region on the substrate. However, within a region a material may contain different phases such that the material may not reflect the nominal stoichiometry of components delivered to the region and may not be pure (e.g., it may be difficult to back out the nominal stoichiometry from a detected phase). For example, a set of components delivered to a region may result in mixtures of crystalline materials, mixtures of amorphous and crystalline materials and mixtures of amorphous materials. Both kinetic and thermodynamic relationships between the components will ultimately determine the exact nature of the material formed in any one region.

Inorganic Materials: Materials which do not contain carbon as a principal element are "inorganic materials." The oxides and sulfides of carbon and the metallic carbides are considered inorganic materials. Examples of inorganic compounds which can be synthesized using the methods of the present invention include, but are not restricted to, the following:

(a) Intermetallics: Intermetallic compounds constitute a unique class of metallic materials that form long-range ordered crystal structures below a critical temperature. Such materials form when atoms of two metals combine in certain proportions to form crystals with a structure that may be unique or from either of the two metals (e.g., NiAl, $CrBe_2$, CuZn, etc.).

(b) Metal Alloys: A substance having metallic properties and which is composed of a mixture of two or more chemical elements of which at least one is a metal.

(c) Magnetic Alloys: An alloy exhibiting ferromagnetism such as silicon-iron, but also iron-nickel alloys, which may contain small amounts of any of a number of other elements (e.g., copper, aluminum, chromium, molybdenum, vanadium, etc.), and iron-cobalt alloys.

(d) Ceramics: Typically, a ceramic is a metal oxide, boride, carbide, nitride, or a mixture of such materials. In addition, ceramics are inorganic, nonmetallic products that are subjected to high temperatures (i.e., above visible red, 540° C. to 1000° C. or higher) during manufacture or use. Such materials include, for example, alumina, zirconia, silicon carbide, aluminum nitride, silicon nitride, the $YBa_2Cu_3O_{7-\delta}$ superconductor, ferrites (e.g., $BaFe_{12}O_{19}$), Zeolite A ($Na_{12}[(SiO_2)_{12}(AlO_2)]\cdot 27H_2O$), soft and permanent magnets, etc.

Composite Materials: Any combination of two materials differing in form or composition on a macroscale. The constituents of composite materials retain their identities, i.e., they do not dissolve or merge completely into one another although they act in concert. Such composite materials may be inorganic, organic or a combination thereof. Included within this definition are, for example, doped materials, dispersed metal catalysts and other heterogeneous solids.

Generally, this invention relates to a method for solution-based mixing of components to form arrays of materials. The methodology of the invention is general for many different types of materials, including for example oxides, sulfides, oxyhalides, etc. The methodology in fact, is so general with regard to the types of materials, that it is applicable to the formation of arrays of diverse materials. The general route is particularly important in combinatorial materials science where an object is to form vast arrays of different materials for testing in different applications. Such applications include catalysis, superconductivity, electroluminescence, etc. In a preferred embodiment, the methods of the present invention are used to prepare inorganic materials, such as transition metal oxides, main group oxides, rare earth oxides, metal silicates, main group silicates, rare earth silicates, metal vanadates, main group vanadates, rare earth vanadates, phosphates, borates, aluminates or mixtures thereof and the like that may be luminescent materials, superconducting materials or catalysts for various heterogeneous reactions.

A combinatorial materials science program can be effectively implemented using the methods of this invention. For example, initially a large compositional space may be rapidly explored through the preparation of compositional gradients within a ternary composition space of components A, B, and C. Such a composition space may be studied through the creation of a triangular matrix of ratios containing 0–100% for each component. The size of the matrix will determine the step size of the gradient. The rapid analysis of such a space will provide valuable data; depending on the step size involved in the matrix, however, local performance maxima may be located at compositions between matrix steps. The preparation of focus arrays or libraries is a possible solution to this issue. After a first library is prepared and screened, a focused second library limited to a compositional range of interest is examined with a finer gradient. This process can continue as long as the high throughput screen can meaningfully distinguish between neighboring library elements. This approach results in finer and finer compositional variants until an optimum composition is obtained.

In one embodiment, this invention provides useful methods for a completely integrated combinatorial materials science research program for the discovery of novel catalysts. Catalyst materials are prepared using parallel synthesis methods, analyzed in situ, and directly evaluated for catalytic performance. An exemplary reaction system is the oxidative dehydrogenation of alkanes. The development of efficient heterogeneous catalysts for the gas phase oxidative dehydrogenation of light paraffins is of particular interest due to the economic benefits of using light paraffins for the production of important base chemicals. See, Studies Sur. Sci. Catal. 110, *Proc. $3^{rd}$ World Congress on Oxidation Catalysis,* Grasselli, R. K., Oyama, S. T., Gaffney, A. M., Lyons, J. E. (eds.), Sep. 21–26, 1997; Cavani, F., Trifirò, F. *Catalysis Today* 24, 307–313 (1995). Light olefins are generally obtained from steam cracking of light paraffins and naphtha and by fluidized catalytic cracking (FCC) processes in oil refining. The replacement of such processes by the catalytic activation and selective oxidation of natural gas components would have obvious and significant economic benefits. See also Thorsteinson, E. M., Wilson, T. P., Young, F. G., Kasai, P. H. *J. Catalysis* 52, 116–132 (1978); U.S. Pat. No. 4,250,346; European Patent Application 0166438; Burch, R., Swarnakar, R. *Appl. Catal.* 70, 129–148 (1991); and Merzouki, M., Taouk, B., Tessier, L., Bordes, E., Courtine, P. *Proc. $10^{th}$ Inter. Congr. Catalysis,* Guczi, L. et al. (eds.) Jul. 19–24, 1992.

To use this invention to discover such a catalyst, spatially resolved arrays (libraries) of catalyst materials are prepared from stabilized sol-gel precursors by automated solution deposition techniques. Combinatorial libraries of solution precursors are created initially in microtiter plates in the form of an 11×11×11 triangular matrix. Metal alkoxide solutions (0.5 M) are prepared by refluxing commercially available metal alkoxides in 2-methoxyethanol after which metal-specific ligand modifiers or stabilizers are added. Virtually the entire periodic table of elements may be combined in this fashion. Each solution is deposited into microtiter wells such that along each row of the triangle the metal ratios are decremented by 10% while maintaining constant volume. This triangular array results in individual metal alkoxide solutions in the wells mapped to each apex of the triangle, binary metal alkoxide solutions along the sides, and ternary mixtures within the interior of the triangle. The array is recreated on a substrate (e.g., by transfer from the microtiter plate to the substrate) and then processed at elevated temperatures, such as calcining at 400° C., as discussed below.

These component mixtures are allowed to gel under ambient conditions and subsequently heat treated (e.g., annealed) as necessary. X-ray diffraction (XRD) and X-ray fluorescence (XRF) are used to determine the catalyst structure and composition, respectively. Catalysts are screened for the reaction of interest using, for example a scanning mass spectrometer, as disclosed in commonly owned copending U.S. patent application Ser. No. 08/946,730, filed Oct. 8, 1997, which is incorporated herein by reference. Catalysts may also be screened for the reaction of interest using, for example a scanning photothermal deflection spectrometer, as disclosed in commonly owned copending U.S. patent application Ser. No. 09/039,991, filed Mar. 16, 1998, which is incorporated herein by reference. Another catalyst screening method uses a fixed bed parallel reactor, as disclosed in commonly owned copending U.S. patent application Ser. No. 09/093,870, filed Jun. 9, 1998, which is incorporated herein by reference.

After catalytic screening, focussed libraries from within the compositional regions shown to have the highest % yield (% selectivity×% ethane conversion) are prepared. In addition, bulk catalyst samples of identical compositions were prepared according to conventional methods for the purpose of structural and catalytic comparisons. In general for this heterogeneous reaction, regularity of the material's surface quality is important since different film qualities may result in different relative surface areas across the array of catalysts. Additionally, samples within a combinatorial library should be as uniform as possible in a macroscopic sense, i.e., the surface areas should be similar. These relationships may be probed by the use of in situ analytical methods. The characterization of composition, phase, and structure are all elements in ascertaining the relationship between flat surface catalysts and bulk catalysts. Confirmation that the material being measured in the flat surface array is the same as the material being measured after scale-up allows catalytic trends to be extracted from flat surface library data and applied toward bulk samples. Composition may be confirmed through a comparison of nominal stoichiometry with XRF data from flat surface catalysts. Phase identification and structural characterization may both be determined through the use of XRD and electron microscopy. Thus, it can be seen how those of skill in this art can effectively utilize the methods of this invention for a combinatorial materials science research program.

The general route of this invention for the formation of an array of materials by a solution route comprises the steps of:

(a) dissolving two or more starting components in a common or compatible solvent(s);

(b) mixing the two or more starting components together;

(c) optionally adding to the mixture an agent to aid in drying or surface quality;

(d) optionally adding to the mixture a stabilizer for the formation of a stable sol or to maintain the two or more starting components in solution;

(e) dispensing the components or component mixtures into the regions of a substrate; and (f) drying and/or heat treating the resulting array.

The mixing and dispensing steps can be in either order, depending on the embodiment of the invention being practiced, either mixing prior to dispensing or mixing in the regions of the substrate.

In some embodiments, this methodology will result in a sol-gel process. Sol-gel methods often describe many different chemical processes. In general, the solution or sol-gel approach provides mixing in solution through the formation of a colloidal dispersion or sol. Hydrolytic linking and continued condensation results in the formation of an interconnected, rigid network, or gel which may be converted to the desired material through drying and calcination. For a general discussion of sol-gel processes see Brinker and Scherer, "Sol-Gel Science: The Physics and Chemistry of Sol-Gel Processing" (Academic Press, Inc. 1990), herein incorporated by reference for all purposes. Drying typically results in an amorphous mixed metal-organic solid. Thereafter, heat-treatment results in a partially-crystalline solid. Optionally, sintering thereafter results in a more completely crystalline material.

Selection and preparation of the components is an important part of this invention. The components may be selected to form a desired material or may be selected to explore a compositional range or phase space. Components are typically selected from commercially available atoms, molecules, compounds or complexes having a desired element. Components typically are in a solid or liquid state. Each component may be independently selected from the group consisting of oxides, alkoxides, aryloxides, allyloxides, diketonates, oxoalkoxides, oxodiketonates, phosphates, phosphines, sulfates, nitrites, nitrates, hydroxides, amines, amides, imides, carbonates, carbonyls, halides, oxyhalides, metals and carboxylates and combinations thereof. The components also typically have a metal or metalloid element selected from the group consisting of Groups 1–17, Lanthanides and Actinides of the Periodic Table of Elements. More specifically, a component can have an element selected from the group consisting of Li, Na, K, Rb, Cs, Mg, Ca, Sr, Ba, Sc, Y, La, Ti, Zr, Hf, V, Ta, Cr, Mo, W, Ru, Os, Ir, Fe, Ni, Pt, Co, Cu, Ag, Au, Zn, Cd, Rh, Pd, P, As, S, Se, Te, Mn, Nb, Re, B, Al, Si, Ga, Ge, In, Sn, Sb, Tl, Pb, Bi, Lu, Ce, Pr, Nd. Sm, Eu, Gd, Th, Dy, Ho, Er, Tm, Yb, Be, Hg, C and N. Specific starting components include gadolinium isopropoxide, tantalum ethoxide, europium (III) nitrate, zinc acetate, chromium (III) 2-ethylhexanoate and the like.

The starting components are dissolved either partly or fully in a solvent. Dissolution must be sufficient so that the component may be handled by handling the liquid comprising the component. Typically, dissolution occurs so that the components are considered either dissolved or suspended, but not a precipitate.

Each starting component may be prepared in a common solvent. In one embodiment, each component is individually dissolved to a reasonable extent in a solvent. The solvent chosen for each starting component can be the same or different, but preferably the solvent is identical for each component. Here, each component is prepared in its own vessel or well. In another embodiment, two or more components may be added together creating a component mixture. Here, two or more components are added together in a single vessel or well using a common solvent. For example, to make doped electroluminescent materials, a component mixture may include both yttrium and terbium components.

The common solvent is a potentially important feature in that the components must all dissolve to some reasonable extent in the chosen solvent. The term "common solvent" does not mean that the solvent must be identical. Instead, the term is used to mean that an identical solvent or solvent mixture can be used with each component. When a solvent mixture is used, the solvents must be compatible (i.e., miscible) with each other. The common solvent may link various parts of the methodology of this invention. The common solvent (with or without stabilizers) that solubilizes all the components for an array of materials is advantageous for solvent handling systems, such as robotics and automated dispensing systems, and for the formation of arrays on substrates for control of wetting properties. For example, the techniques of this invention generally allow the synthesis and manipulation of these components in air.

With a preferred choice of solvent, the starting components may react with the solvent, possibly in a ligand exchange reaction. It has been found that such reactions aid in the process of forming a stable solution or sol for the formation of a material. The structure of the species in solution can bear little resemblance to the starting components. The reactivity, for example the hydrolysis rates, of the components in solution may be altered from the starting components. A preferred choice of solvent are alcohols and most preferably the solvent is an alkoxy alcohol such as those selected from the group consisting of 2-methoxyethanol, 2-methoxpropanol, 2-ethoxyethanol and the like. 1,3-propanediol, 1,4-dioxane, tetrahydrofuran, pyridine, neopentanol and triethanolamine can also be used. Also, the examples herein provide a good range of examples for selection of solvents for particular classes of materials.

For example, the starting components may be in the form of $M(OR)_x$ where M is a metal, O is oxygen, R is a hydrocarbyl and x is the number of ligands attached to the metal. An $M(OR)_x$ starting component is then mixed with a solvent, such as 2-methoxyethanol, to form $M(OR)_{x-y}(OC_2H_4OCH_3)_y$ where y+x is the number of ligands attached to the metal. x may equal y. For purposes of this invention, the exact numbers for x and y are not important. Moreover, the exact number for x and y vary depending on the metal chosen as well as the conditions used for mixing, e.g., heating, atmosphere, etc. M is chosen from the list given above.

In those embodiments using metal alkoxides, the corresponding alcohol is the preferred common solvent, such as for metal ethoxide, ethanol is a preferable choice of solvent and for metal propoxides, propanol is a preferable solvent. For metal isopropoxides, isopropanol is a preferable solvent. For metal butoxides, butanol is a preferable solvent. For metal isobutoxides isobutanol is a preferable solvent. The most preferred common solvents are functional alcohols such as 2-methoxyethanol. A variety of metal alkoxides can be solubilized in 2-methoxyethanol by refluxing, heating and/or through judicious choice of modifying ligands, etc. In using the sol-gel process, it is desirable for the major component to be a metal alkoxide; however, combinations of metal alkoxides can be used with other components such as nitrates, acetates, etc.

Modifying ligands or stabilizers may be added to the individual components or to the mixtures of components. The nature and concentration of the modifying ligands will depend on the components in the solution or on the mixture of components. A modifying ligand that is used for one particular component may be incompatible with the presence of another component in the solution or in the component mixtures. In this instance a different modifying ligand may be selected. Stabilizers are chosen to avoid precipitation of any component in the mixture. Additionally, order of addition of components and stabilizers to the component mixture may be important to maintain dissolution. Preferred modifying ligands or stabilizers are typically molecules or solvent molecules that contain functional groups capable of reaction with or binding to the components in solution. Stabilizers can be selected from the group consisting of alcohols, carboxylates, ketones, aldehydes, amines, amides, amino acids, alkanolamines and combinations thereof. A most preferred choice of stabilizer is selected from the group consisting of 2,4-pentanedione, 2,3-pentanedione, acetic acid, triethanolamine, diethanolamine, 1,1,1-tris(hydroxymethyl)ethane, dipentaerythritol, pentaerythritol, tricine, ethanolamine and sugars (such as glucose and the like).

Metal nitrates may be modified in an aqueous solution with the addition of citric acid and/or ethylene glycol as an alternative to alkoxide sol-gel processes. Using a chelating process, metal nitrates or other soluble salts are initially dissolved in water followed by the addition of citric acid to chelate the metal cations. In those embodiments using metal nitrates as components, water is a preferable choice of solvent. When a polyhydroxyalcohol, such as ethylene glycol, is added, the chelated metal centers react with the ethylene glycol forming organic esters. Heating results in polyesterification and the formation of large metal/organic polymers. Solution viscosity may be tailored through the modification of the citric acid/ethylene glycol ratio. The ratio of metal nitrate to citric acid can range from about 1:1 to about 1:100. Similarly, the ratio of metal nitrate to ethylene glycol can range from about 1:1 to about 1:100. Citric acid can be replaced with other chelating agents known to those of skill in the art, such as polyaminoacids like poly-glutamic acid.

Once the components are prepared either individually or as component mixtures, they may be mixed together. Mixing may have occurred already by the preparation of one or more component mixtures. If not, however, the components may be mixed together in a common vessel or well or in a region on the substrate. Good mixing increases the likelihood of preparing the desired material or range of materials. Mixing is accomplished in any one of many manual or automatic methods. Mixing can be manual such as by shaking the vessel or well. Mixing can also be automatic such as by using an inert ball bearing in a shaken vessel or array of vessels, such as a titer plate. Mixing can also be accomplished via a dispenser that repeatedly aspirates and dispenses some or all of the contents of a vessel or well. In a preferred embodiment, mixing is performed in the nozzle of an automatic dispensing robot that repeatedly aspirates and dispenses some or all of the contents of a vessel or well. Other mixing methods include agitation of the solution with a gas stream, diffusion, sonication or other agitation techniques known to those skilled in the art.

The components can form a single material, but preferably are mixed to form an array of materials. Mixing the components or component mixtures in different amounts or ratios forms an array of materials. The components can be mixed in any ratio. Typically an aliquot of each desired starting component or component mixture is added to a common vessel or well for mixing. In the formation of an array of materials, different ratios of each of the starting components can be mixed for each material in the array.

If there is a two component material being prepared, a phase space is formed to examine the complete range of component variation. A first array may be formed by selecting an amount consistent with the size of the region being used (discussed below) and mixing an appropriate molar amount of component A and component B so that the first region of the substrate contains 100% of component A and 0% of component B. The second region may contain 90% of component A and 10% of component B. The third region may contain 80% of component A and 20% of component B. This is repeated until a final region contains 0% of component A and 100% of component B. Array formation in this fashion applies to as many components as desired, including 3 component materials, 4 component materials, 5 component materials and 6 component materials.

Thus, the following tables show examples of arrays with multiple components in particular ratios. The ratios can be molar, weight percent, atomic or volume:

TABLE 1

Example of a 1 × 11 array for a two component (A:B) composition space,
wherein A and B are in opposing gradients.

| | | | | | | | | | | |
|---|---|---|---|---|---|---|---|---|---|---|
| 100:0 | 90:10 | 80:20 | 70:30 | 60:40 | 50:50 | 40:60 | 30:70 | 20:80 | 10:90 | 0:100 |

TABLE 2

Example of an 11 × 11 × 11 (66 region) triangular array for components A:B:C. This table shows A:B:C ratios.

| | | | | | | | | | | |
|---|---|---|---|---|---|---|---|---|---|---|
| 100:0:0 | | | | | | | | | | |
| 90:10:0 | 90:0:10 | | | | | | | | | |
| 80:20:0 | 80:10:10 | 80:0:20 | | | | | | | | |
| 70:30:0 | 70:20:10 | 70:10:20 | 70:0:30 | | | | | | | |
| 60:40:0 | 60:30:10 | 60:20:20 | 60:10:30 | 60:0:40 | | | | | | |
| 50:50:0 | 50:40:10 | 50:30:20 | 50:20:30 | 50:10:40 | 50:0:50 | | | | | |
| 40:60:0 | 40:50:10 | 40:40:20 | 40:30:30 | 40:20:40 | 40:10:50 | 40:0:60 | | | | |
| 30:70:0 | 30:60:10 | 30:50:20 | 30:40:30 | 30:30:40 | 30:20:50 | 30:10:60 | 30:0:70 | | | |
| 20:80:0 | 20:70:10 | 20:60:20 | 20:50:30 | 20:40:40 | 20:30:50 | 20:20:60 | 20:10:70 | 20:0:80 | | |
| 10:90:0 | 10:80:10 | 10:70:20 | 10:60:30 | 10:50:40 | 10:40:50 | 10:30:60 | 10:20:70 | 10:10:80 | 10:0:90 | |
| 0:100:0 | 0:90:10 | 0:80:20 | 0:70:30 | 0:60:40 | 0:50:50 | 0:40:60 | 0:30:70 | 0:20:80 | 0:10:90 | 0:0:100 |

TABLE 3

Example of 4 components (A, B, C and D) where A:B are in opposing gradients and C:D are also in opposing gradients, but running perpendicular to A:B. The nominal stoichiometry can be defined by $A_{1-x}B_xC_{1-y}D_y$ where x and y = 0 to 1.0 (steps 0.1). This table shows A:B:C:D ratios.

| | | | | | | | | | | |
|---|---|---|---|---|---|---|---|---|---|---|
| 50:0:50:0 | 45:5:50:0 | 40:10:50:0 | 35:15:50:0 | 30:20:50:0 | 25:25:50:0 | 20:30:50:0 | 15:35:50:0 | 10:40:50:0 | 5:45:50:0 | 0:50:50:0 |
| 50:0:45:5 | 45:5:45:5 | 40:10:45:5 | 35:15:45:5 | 30:20:45:5 | 25:25:45:5 | 20:30:45:5 | 15:35:45:5 | 10:40:45:5 | 5:45:45:5 | 0:50:45:5 |
| 50:0:40:10 | 45:5:40:10 | 40:10:40:10 | 35:15:40:10 | 30:20:40:10 | 25:25:40:10 | 20:30:40:10 | 15:35:40:10 | 10:40:40:10 | 5:45:40:10 | 0:50:40:10 |
| 50:0:35:15 | 45:5:35:15 | 40:10:35:15 | 35:15:35:15 | 30:20:35:15 | 25:25:35:15 | 20:30:35:15 | 15:35:35:15 | 10:40:35:15 | 5:45:35:15 | 0:50:35:15 |
| 50:0:30:20 | 45:5:30:20 | 40:10:30:20 | 35:15:30:20 | 30:20:30:20 | 25:25:30:20 | 20:30:30:20 | 15:35:30:20 | 10:40:30:20 | 5:45:30:20 | 0:50:30:20 |
| 50:0:25:25 | 45:5:25:25 | 40:10:25:25 | 35:15:25:25 | 30:20:25:25 | 25:25:25:25 | 20:30:25:25 | 15:35:25:25 | 10:40:25:25 | 5:45:25:25 | 0:50:25:25 |
| 50:0:20:30 | 45:5:20:30 | 40:10:20:30 | 35:15:20:30 | 30:20:20:30 | 25:25:20:30 | 20:30:20:30 | 15:35:20:30 | 10:40:20:30 | 5:45:20:30 | 0:50:20:30 |
| 50:0:15:35 | 45:5:15:35 | 40:10:15:35 | 35:15:15:35 | 30:20:15:35 | 25:25:15:35 | 20:30:15:35 | 15:35:15:35 | 10:40:15:35 | 5:45:15:35 | 0:50:15:35 |
| 50:0:10:40 | 45:5:10:40 | 40:10:10:40 | 35:15:10:40 | 30:20:10:40 | 25:25:10:40 | 20:30:10:40 | 15:35:10:40 | 10:40:10:40 | 5:45:10:40 | 0:50:10:40 |
| 50:0:5:45 | 45:5:5:45 | 40:10:5:45 | 35:15:5:45 | 30:20:5:45 | 25:25:5:45 | 20:30:5:45 | 15:35:5:45 | 10:40:5:45 | 5:45:5:45 | 0:50:5:45 |
| 50:0:0:50 | 45:5:0:50 | 40:10:0:50 | 35:15:0:50 | 30:20:0:50 | 25:25:0:50 | 20:30:0:50 | 15:35:0:50 | 10:40:0:50 | 5:45:0:50 | 0:50:0:50 |

TABLE 4

Example of an 11 × 11 array made with 4 components A, B, C and D. Two triangular segments in the array each represent ternary compositional variations in the ratios of A:B:C and A:C:D where the binary trace A:C is common to both segments. The upper left corner is pure component A, the bottom left corner is pure component B, the bottom right corner is pure component C and the upper right corner is pure component D. This table shows A:B:C:D ratios.

| | | | | | | | | | | |
|---|---|---|---|---|---|---|---|---|---|---|
| 100:0:0:0 | 90:0:0:10 | 80:0:0:20 | 70:0:0:30 | 60:0:0:40 | 50:0:0:50 | 40:0:0:60 | 30:0:0:70 | 20:0:0:80 | 10:0:0:90 | 0:0:0:100 |
| 90:10:0:0 | 90:0:10:0 | 80:0:10:10 | 70:0:10:20 | 60:0:10:30 | 50:0:10:40 | 40:0:10:50 | 30:0:10:60 | 20:0:10:70 | 10:0:10:80 | 0:0:10:90 |
| 80:20:0:0 | 80:10:10:0 | 80:0:20:0 | 70:0:20:10 | 60:0:20:20 | 50:0:20:30 | 40:0:20:40 | 30:0:20:50 | 20:0:20:60 | 10:0:20:70 | 0:0:20:80 |
| 70:30:0:0 | 70:20:10:0 | 70:10:20:0 | 70:0:30:0 | 60:0:30:10 | 50:0:30:20 | 40:0:30:30 | 30:0:30:40 | 20:0:30:50 | 10:0:30:60 | 0:0:30:70 |
| 60:40:0:0 | 60:30:10:0 | 60:20:20:0 | 60:10:30:0 | 60:0:40:0 | 50:0:40:10 | 40:0:40:20 | 30:0:40:30 | 20:0:40:40 | 10:0:40:50 | 0:0:40:60 |
| 50:50:0:0 | 50:40:10:0 | 50:30:20:0 | 50:20:30:0 | 50:10:40:0 | 50:0:50:0 | 40:0:50:10 | 30:0:50:20 | 20:0:50:30 | 10:0:50:40 | 0:0:50:50 |
| 40:60:0:0 | 40:50:10:0 | 40:40:20:0 | 40:30:30:0 | 40:20:40:0 | 40:10:50:0 | 40:0:60:0 | 30:0:60:10 | 20:0:60:20 | 10:0:60:30 | 0:0:60:40 |
| 30:70:0:0 | 30:60:10:0 | 30:50:20:0 | 30:40:30:0 | 30:30:40:0 | 30:20:50:0 | 30:10:60:0 | 30:0:70:0 | 20:0:70:10 | 10:0:70:20 | 0:0:70:30 |
| 20:80:0:0 | 20:70:10:0 | 20:60:20:0 | 20:50:30:0 | 20:40:40:0 | 20:30:50:0 | 20:20:60:0 | 20:10:70:0 | 20:0:80:0 | 10:0:80:10 | 0:0:80:20 |
| 10:90:0:0 | 10:80:10:0 | 10:70:20:0 | 10:60:30:0 | 10:50:40:0 | 10:40:50:0 | 10:30:60:0 | 10:20:70:0 | 10:10:80:0 | 10:0:90:0 | 0:0:90:10 |
| 0:100:0:0 | 0:90:10:0 | 0:80:20:0 | 0:70:30:0 | 0:60:40:0 | 0:50:50:0 | 0:40:60:0 | 0:30:70:0 | 0:20:80:0 | 0:10:90:0 | 0:0:100:0 |

TABLE 5

Example of an 11 × 11 array made from 3 components A, B and C where A:B are in opposing gradients, A:C are also in opposing gradients, but perpendicular to A:B. This table shows A:B:C ratios.

| | | | | | | | | | | |
|---|---|---|---|---|---|---|---|---|---|---|
| 100:0:0 | 95:0:5 | 90:0:10 | 85:0:15 | 80:0:20 | 75:0:25 | 70:0:30 | 65:0:35 | 60:0:40 | 55:0:45 | 50:0:50 |
| 95:5:0 | 90:5:5 | 85:5:10 | 80:5:15 | 75:5:20 | 70:5:25 | 65:5:30 | 60:5:35 | 55:5:40 | 50:5:45 | 45:5:50 |
| 90:10:0 | 85:10:5 | 80:10:10 | 75:10:15 | 70:10:20 | 65:10:25 | 60:10:30 | 55:10:35 | 50:10:40 | 45:10:45 | 40:10:50 |
| 85:15:0 | 80:15:5 | 75:15:10 | 70:15:15 | 65:15:20 | 60:15:25 | 55:15:30 | 50:15:35 | 45:15:40 | 40:15:45 | 35:15:50 |
| 80:20:0 | 75:20:5 | 70:20:10 | 65:20:15 | 60:20:20 | 55:20:25 | 50:20:30 | 45:20:35 | 40:20:40 | 35:20:45 | 30:20:50 |
| 75:25:0 | 70:25:5 | 65:25:10 | 60:25:15 | 55:25:20 | 50:25:25 | 45:25:30 | 40:25:35 | 35:25:40 | 30:25:45 | 25:25:50 |
| 70:30:0 | 65:30:5 | 60:30:10 | 55:30:15 | 50:30:20 | 45:30:25 | 40:30:30 | 35:30:35 | 30:30:40 | 25:30:45 | 20:30:50 |

TABLE 5-continued

Example of an 11 × 11 array made from 3 components A, B and C where A:B are in opposing gradients, A:C are also in opposing gradients, but perpendicular to A:B. This table shows A:B:C ratios.

| 65:35:0 | 60:35:5 | 55:35:10 | 50:35:15 | 45:35:20 | 40:35:25 | 35:35:30 | 30:35:35 | 25:35:40 | 20:35:45 | 15:35:50 |
|---|---|---|---|---|---|---|---|---|---|---|
| 60:40:0 | 55:40:5 | 50:40:10 | 45:40:15 | 40:40:20 | 35:40:25 | 30:40:30 | 25:40:35 | 20:40:40 | 15:40:45 | 10:40:50 |
| 55:45:0 | 50:45:5 | 45:45:10 | 40:45:15 | 35:45:20 | 30:45:25 | 25:45:30 | 20:45:35 | 15:45:40 | 20:45:45 | 5:45:50 |
| 50:50:0 | 45:50:5 | 40:50:10 | 35:50:15 | 30:50:20 | 25:50:25 | 20:50:30 | 15:50:35 | 10:50:40 | 5:50:45 | 0:50:50 |

TABLE 6

Example of a 6 × 6 array, similar to Table 5, with gradient steps twice that of Table 5. This table shows A:B:C ratios.

| 100:0:0 | 90:0:10 | 80:0:20 | 70:0:30 | 60:0:40 | 50:0:50 |
|---|---|---|---|---|---|
| 90:10:0 | 80:10:10 | 70:10:20 | 60:10:30 | 50:10:40 | 40:10:50 |
| 80:20:0 | 70:20:10 | 60:20:20 | 50:20:30 | 40:20:40 | 30:20:50 |
| 70:30:0 | 60:30:10 | 50:30:20 | 40:30:30 | 30:30:40 | 20:30:50 |
| 60:40:0 | 50:40:10 | 40:40:20 | 30:40:30 | 20:40:40 | 10:40:50 |
| 50:50:0 | 40:50:10 | 30:50:20 | 20:50:30 | 10:50:40 | 0:50:50 |

As can be seen from these tables, the materials at the "corners" may comprise less than two components. In the two component 1×11 array, there is only one component at each end (e.g., 100% A or 100% B). Similarly with three or more components, the "corners" of the array will have only one component. Typically, the single component members of the array are used as a reference for the component mixtures when properties are measured or screened or when the materials are characterized.

It is also possible to change the ratio of components so that a denser or "focused" array is formed. One strategy is to form an array having a large variation between components, such as the 10% change exemplified above in Table 1 and then test that array for the desired property. Thereafter, a second, more focused array can be formed surrounding an interesting result based on the test for the desired property. For example, if an interesting result is found for the material formed from 80% of component A and 20% of component B, then an array can be formed with 1% changes in component A and component B from 70–90% of component A and 10–30% of component B. Thereafter, this second "focused" array can be tested for the desired property.

Moreover, in another embodiment of the present invention, a method is provided for forming at least two different arrays of materials by delivering substantially the same components at substantially identical concentrations to regions on both first and second substrates and, thereafter, subjecting the components on the first substrate to a first set of reaction conditions and the components on the second substrate to a second set of reaction conditions in a wide array of compositions. Using this method, the effects of the various reaction parameters can be studied and, in turn, optimized. Reaction parameters which can be varied include, for example, solvents, temperatures, reaction times, the pressures at which the reactions are carried out, the atmospheres in which the reactions are conducted, the rates at which the reactions are quenched, etc. Other reaction parameters which can be varied will be apparent to those of skill in the art. Another embodiment is where an array of materials, after its formation, is thereafter subjected to further processing (such as heat treating in an alternative atmosphere) to create an array of different materials.

The array can have as many materials as there are regions on the substrate. For purposes of this invention, the number of materials is typically equal to the number of regions on the substrate, unless certain regions are left empty. The number of regions on the substrate is discussed below, but applies to the number of materials.

Although mixing can be done on the substrate as described above, typically, mixing is performed prior to depositing the components into or onto the array. The mixing can take place in a microtiter plate, for example. Thereafter, an aliquot of the mixed components is delivered to a region on the substrate. Dispensing or delivery of the components to the regions can be accomplished in any one of a number of manual or automatic methods.

The components or materials in the individual regions should be prevented from moving to adjacent regions. Most simply, this can be ensured by leaving a sufficient amount of space between the regions on the substrate so that the various components cannot interdiffuse between reaction regions. Moreover, this can be ensured by providing an appropriate barrier between the various regions on the substrate. In one approach, a mechanical device or physical structure defines the various regions on the substrate. A wall or other physical barrier, for example, can be used to prevent the reactant components in the individual reaction regions from moving to adjacent reaction regions. This wall or physical barrier may be removed after the synthesis is carried out. One of skill in the art will appreciate that, at times, it may be beneficial to remove the wall or physical barrier before screening the array of materials.

In another approach, a hydrophobic material, for example, can be used to coat the region surrounding the individual reaction regions. Such materials prevent aqueous (and certain other polar) solutions from moving to adjacent reaction regions on the substrate. Of course, when non-aqueous or nonpolar solvents are employed, different surface coatings will be required. Moreover, by choosing appropriate materials (e.g., substrate material, hydrophobic coatings, reactant solvents, etc.), one can control the contact angle of the droplet with respect to the substrate surface. Large contact angles are desired because the area surrounding the reaction region remains unwetted by the solution within the reaction region.

Alternatively or additionally, a dimple or other recess can be used to prevent the reactant components in the individual reaction regions from moving to adjacent reaction regions. If the substrate used in the present invention is to contain dimples or other recesses, the dimples should be sufficiently small to allow close packing on the substrate, mostly for economical reasons. Preferably, the dimples will be less than about 5 mm in diameter, less than 1 mm in diameter, preferably less than 0.5 mm in diameter, more preferably less than 10,000 μm in diameter, even more preferably less than 100 μm in diameter, and still more preferably less than 25 μm in diameter. For inorganic materials, typically a dimple of about 1–3 mm is employed. In some embodiments, the depth of such dimples will preferably be less than 100 μm and more preferably less than 25 μm and most preferably less than 10 µm below the upper surface of the substrate. In other embodiments, for example where a greater bulk of material is desired, the depth of such dimples will be in the range of about 10 µm to about 1,000 µm.

In addition the surface of the dimple is important. For example, if the dimple has a smooth surface, the adhesion of the material to the dimple may not be particularly good. Moreover, a very rough dimple surface could create inconsistent drying, sintering or calcinating problems. A rough dimple surface also increases the chances of the substrate molecules interdiffusing with the material being made in the dimple. These issues can be resolved by one of skill in the art for the materials being made. The preferred approach here is to have a dimple created by bead blasting, which creates a dimple surface that is somewhat rough, i.e., not completely smooth. The roughness of the dimple surface is not preferably so rough such that dimples within dimples are created. In other words, preferably, the dimple surface is rough enough to assist in adhesion of the material to the dimple.

Dimples having these characteristics can be produced by a variety of techniques including laser, pressing, or etching techniques. A suitable dimpled substrate surface can, for example, be provided by pressing the substrate with an imprinted "master" such as those commonly used to prepare compact optical disks. In addition, an isotropic or anisotropic etching technique employing photolithography can be employed. In such techniques, a mask is used to define the reaction regions on the substrate. After the substrate is irradiated through the mask, selected regions of the photoresist are removed to define the arrangement of reaction regions on the substrate. The dimples may be cut into the substrate with standard plasma or wet etching techniques. If the substrate is a glass or silicon material, suitable wet etch materials can include hydrogen fluoride, or other common wet etchants used in the field of semiconductor device fabrication. Suitable plasma etchants commonly used in the semiconductor device fabrication field can also be employed. Such plasma etchants include, for example, mixtures of halogen containing gases and inert gases. Typically, a plasma etch will produce dimples having a depth of less than 10 µm, although depths of up to 50 µm may be obtained under some conditions.

Another method for preparing a suitably dimpled surface employs photochemically etchable glass or polymer sheets. For example, a photochemically etchable glass known as "FOTOFORM" is available from Corning Glass Company (New York). Upon exposure to radiation through a mask, the glass becomes soluble in aqueous solutions. Thereafter, the exposed glass is simply washed with the appropriate solution to form the dimpled surface. With this material, well-defined dimples can be made having aspect ratios of 10 to 1 (depth to diameter) or greater, and depths of up to 0.1 inches. Dimple diameters can be made as small as 25 µm in a 250 µm thick glass layer. Moreover, the dimpled surface can contain thereon an adsorbent (for example, cellulose) to which the components of interest are delivered.

Even when a dimpled surface is employed, it is often important to ensure that the substrate material is not wetted beyond the region parameters. Most simply, this can be ensured by leaving a sufficient amount of space between the regions on the substrate so that the various components cannot interdiffuse between reaction regions. In addition, other techniques can be applied to control the physical interactions that affect wetting, thereby ensuring that the solutions in the individual reaction regions do not wet the surrounding surface and contaminate other reaction regions.

Whether or not a liquid droplet will wet a solid surface is governed by three tensions: the surface tension at the liquid-air interface, the interfacial tension at the solid-liquid interface and the surface tension at the solid-air interface. If the sum of the liquid-air and liquid-solid tensions is greater than the solid-air tension, the liquid drop will form a bead (a phenomenon known as "lensing"). If, on the other hand, the sum of the liquid-air and liquid-solid tensions is less than the solid-air tension, the drop will not be confined to a given location, but will instead spread over the surface. Even if the surface tensions are such that the drop will not spread over the surface, the contact or wetting angle (i.e., the angle between the edge of the drop and the solid substrate) may be sufficiently small that the drop will cover a relatively large area (possibly extending beyond the confines of a given reaction region). Further, small wetting angles can lead to formation of a thin (approximately 10 to 20°) "precursor film" which spreads away from the liquid bead. Larger wetting angles provide "taller" beads that take up less surface area on the substrate and do not form precursor films. Specifically, if the wetting angle is greater than about 90°, a precursor film will not form.

Methods for controlling chemical compositions and, in turn, the local surface free energy of a substrate surface include a variety of techniques apparent to those in the art. Chemical vapor deposition and other techniques applied in the fabrication of integrated circuits can be applied to deposit highly uniform layers on selected regions of the substrate surface. If, for example, an aqueous reactant solution is used, the region inside the reaction regions may be hydrophilic, while the region surrounding the reaction regions may be hydrophobic. As such, the surface chemistry can be varied from position to position on the substrate to control the surface free energy and, in turn, the contact angle of the drops of reactant solution. In this manner, an array of reaction regions can be defined on the substrate surface.

In one method, the substrate is prepared for receiving the mixture of components by starting with a flat silicon substrate and chemically modifying it using organosilane reagents, such as $CH_3(CH_2)_n SiCl_3$ where $0 \leq n \leq 17$. The organosilane reagent is chosen to lend particular wetting characteristics to the substrate surface. Typically, the substrate is sonicated for about 15–20 minutes in isopropanol or another alcohol or with other times and solvents to clean the substrate. The substrate is then rinsed with distilled and de-ionized water, dried under a nitrogen gas jet and heated at 120° C. for about 20–30 minutes. The exact conditions for this cleaning and drying can vary depending on the exact silane chosen as well as the substrate chosen. After cooling, the substrate is placed in a 5% v/v solution of the silane in a solvent (such as dichloromethane), then removed from the solvent, washed (for example with methanol), and then dried under a nitrogen gas jet. This entire process can be repeated one or more times. The silane used to modify the surface is chosen to affect the wetting properties of the substrate appropriate for the common solvent employed to ensure isolation of the regions on the substrate, thereby encouraging the mixture of components to remain in the regions. After the substrate is chemically modified through silanization, an array of regions is created by bead blasting through a patterned mask with grit. A preferred grit is 50 µm alumina grit. The array of dimples takes the pattern of the mask. In a preferred pattern, a plurality of round 3 mm diameter regions is constructed on the substrate using a stainless steel mask with sufficient spacing so that the materials do not intermix, e.g., 4 mm. Once the substrate is prepared, solutions of the starting components are deposited in the individual regions on the substrate.

Essentially, any conceivable substrate can be employed in the invention. The substrate can be organic, inorganic, biological, nonbiological, or a combination of any of these, existing as particles, strands, precipitates, gels, sheets, tubing, spheres, containers, capillaries, pads, slices, films, plates, slides, etc. The substrate can have any convenient shape, such a disc, square, sphere, circle, etc. The substrate is preferably flat, but may take on a variety of alternative surface configurations. For example, the substrate may contain raised or depressed regions on which the synthesis of diverse materials takes place. The substrate may be any of a wide variety of materials including, for example, polymers, plastics, Pyrex, quartz, resins, silicon, silica or silica-based materials, carbon, metals, inorganic glasses, inorganic crystals, membranes, etc. Other substrate materials will be readily apparent to those of skill in the art upon review of this disclosure. Surfaces on the solid substrate can be composed of the same materials as the substrate or, alternatively, they can be different, i.e., the substrates can be coated with a different material. Moreover, the substrate surface can contain thereon an adsorbent (for example, cellulose) to which the components of interest are delivered. The most appropriate substrate and substrate-surface materials will depend on the class of materials to be synthesized and the selection in any given case will be readily apparent to those of skill in the art.

In some embodiments, a region on the substrate and, therefore, the area upon which each distinct material is synthesized is smaller than about 25 cm$^2$, preferably less than 10 cm$^2$, more preferably less than 5 cm$^2$, even more preferably 1 cm$^2$, still more preferably less than 1 mm$^2$, and still more preferably less than 0.5 mm$^2$. In most preferred embodiments, the regions have an area less than about 10,000 μm$^2$, preferably less than 1,000 μm$^2$, more preferably less than 100 μm$^2$, and even more preferably less than 10 μm$^2$.

A single substrate can have at least 10, 25 or 50 different materials and, more preferably, at least 100 or 500 different materials synthesized thereon. In even more preferred embodiments, a single substrate has more than 10$^3$, 10$^4$, 10$^5$, 10$^6$, or more materials synthesized thereon. In some embodiments, the delivery process is repeated to provide materials with as few as two components, although the process may be readily adapted to form materials having 3, 4, 5, 6, 7, 8 or more components therein. The density of regions per unit area will be greater than 0.04 regions/cm$^2$, more preferably greater than 0.1 regions/cm$^2$, even more preferably greater than 1 region/cm$^2$, even more preferably greater than 10 regions/cm$^2$, and still more preferably greater than 100 regions/cm$^2$. In most preferred embodiments, the density of regions per unit area will be greater than 1,000 regions/cm$^2$, more preferably 10,000 regions/cm$^2$, and even more preferably greater than 100,000 regions/cm$^2$.

Using the dispenser systems discussed in commonly owned and copending U.S. patent application Ser. No. 08/327,513, previously incorporated by reference, the components or component mixtures can be delivered to regions on the substrate either sequentially or simultaneously. In a presently preferred embodiment, the components or component mixtures are simultaneously delivered to either a single predefined region on the substrate or, alternatively, to multiple predefined regions on the substrate. For example, using an ink-jet dispenser having two nozzles, two different components can be simultaneously delivered to a single predefined region on the substrate. Alternatively, using this same ink-jet dispenser, a component can be simultaneously delivered to two different predefined regions on the substrate. In this instance, the same component or, alternatively, two different components can be delivered. If the same component is delivered to both of the predefined regions, it can be delivered at either the same or different concentrations. Similarly, using an ink-jet dispenser having eight nozzles, for example, eight different component scan be simultaneously delivered to a single predefined region on the substrate or, alternatively, eight components (either the same or different) can be simultaneously delivered to eight different predefined regions on the substrate.

Once the array of components or component mixtures have been delivered to regions on the substrate, the entire array can be dried, calcined, sintered or otherwise heat treated at various conditions for various times for formation of the material(s). Heating times, temperatures and atmospheres can be adjusted as desired. Heating history, such as ramp rates and heating times, can affect the phase purity, crystallinity and properties of the resulting materials. For example, heating with multiple steps may be desired.

Of general importance for this invention, is that the one or more mixtures not react substantially with the substrate, unless intended (e.g., use of a silicon substrate and desiring Si in the formed material). Although some interdiffusion of molecules between the substrate and the one or more mixtures can be tolerated as a result of the drying, heating, calcinating or sintering step(s), the bulk of the material made should not include components or molecules from the substrate. Heating times and temperatures can be adjusted to account for different mixtures in conjunction with different substrate compositions. In converse, however, the mixtures should remain associated with the regions on the substrate after drying, sintering, calcinating and/or heating. For example, in the case of a substrate containing dimples (i.e., regions), the materials should remain in the dimple. Also, by remaining associated with a region, the materials in the array typically cannot interdiffuse.

Traditional routes to solid-state synthesis involve the sintering of solid reactants. The standard method used to synthesize superconductors, for example, is to grind several metal-oxide powders together, compress the mixture and, thereafter, heat-treated at a temperature ranging from 800° C. to about 1000° C. for an extended period of time that can be days or even weeks. The elements in the powder mixture sinter, i.e., they react chemically to form new compounds and diffuse into a solid, without passing through the liquid or gaseous phase. Gaseous elements, such as oxygen, can be taken up during heating or, alternatively, in a subsequent step, and the pressure of the system can be varied during the synthesis process.

In contrast to such traditional routes, in the present invention, new routes to solid-synthesis focus on the synthesis of materials at lower temperatures. It has been found that reaction rates can be increased at lower temperatures by drastically shortening the distance required for diffusion of the reactants and by increasing the surface to volume ratio. This can be achieved by delivering the components to the substrate in the form of a solution as in the present invention. Moreover, when the temperature ranges from about 200° C. to about 600° C., a molten salt can be employed to dissolve the reactant components. This technique is generally referred to as the flux method. Similarly, in a hydrothermal method, water or other polar solvent containing a soluble inorganic salt is employed to dissolve the components. The hydrothermal method is usually carried out under pressure and at a temperature ranging from about 100° C. to about 400° C. Moreover, using the various synthetic routes of the present invention, the array of components can be pressurized or depressurized under an inert atmosphere, oxygen or other gas. In addition, in the synthetic routes of the present invention, various regions on the substrate can be exposed to different heat histories using, for example, laser thermolysis, wherein bursts of energy of a predetermined duration and intensity are delivered to target regions on the substrate.

Typically, drying is the first processing step after the components are delivered and mixed (or mixed and delivered). Drying may cause gelling for those mixtures that are sols upon deposition. Drying is done at a range of from ambient temperature to about 80° C. in air or other atmospheres for a time in the range of from about 30 minutes to about 2 days. Drying may also take place by other processes, such a freeze drying, supercritical drying or other drying techniques known to those of skill in the art. In order to aid in surface quality of the dried material, an additive can be deposited onto the regions of the substrate prior to depositing the components or mixture of components. More typically, the drying agent is added to the component mixtures. The use of drying agents may change the surface tension, vapor pressure, solvent viscosity and other properties of the component mixtures as described, by Brinker, previously incorporated by reference. Such agents may also have an affect on other physical characteristics such as pore size and structure of the nascent solid. Such modifications may affect the surface quality of the dried material. Such additives can be selected from the group consisting of polymers (such as polyethylene glycol and polyvinyl alcohol), surfactants, formamide, oxalic acid, dimethyl formamide, glycerol and ethylene glycol. These additives may also assist in adhering the material to the region during drying.

After drying, the substrate with the dried mixture of components is heated for a prescribed time at a prescribed temperature under a prescribed atmosphere. Also, the temperature is increased and decreased at controlled rates, using ramping rates possibly holding times and then further heating. Selection of the desired heat-treating depends on a number of factors, including without limitation the material being made, the components in the mixture, the solvent and the substrate. Depending on the substrate selected, and there may be more or less diffusion of substrate molecules into the material being made in a region. For example with a sapphire substrate, diffusion is typically not an issue at reasonable heating temperatures and times (such as below 1100° C. for 2 days); however with a silicon substrate it may be necessary to carefully control heating temperatures and times to avoid diffusion of silicon molecules into the material.

Typically, heating temperatures range from about 100° C. to about 1100° C. The nature of the substrate and the reactivity of the substrate with the components dictate the upper temperature limit. The upper temperature limit may in turn create a limit on the heating time. Depending on the nature of the material being investigated, a number of different heating temperatures may be used. For example, the temperature at which luminescent materials may be heated will be dictated by the crystallization temperature of the material. Heating times range from about 30 minutes to about 48 hours, more typically less than 12 hours. Heating times and temperatures for this invention are somewhat smaller and shorter than conventional methods because of the volume of material being made in the array. Heating atmospheres can be selected depending on the materials being made. For example, if a sulfide material is desired, the atmosphere can be $H_2S$. An oxidizing atmosphere of air, oxygen or oxygen in nitrogen or another inert gas can also be employed. $H_2$ or $H_2$ in nitrogen or another inert gas can be used as a reducing atmosphere.

Heat treating typically is carried out according to a schedule that heats the components at a first temperature in the range of about room temperature to about 120° C. for a period of about 1 hour to about 4 hours. Thereafter, the array with the components is heated at a second temperature in the range of about 160° C. to about 220° C. for a period of about 1 hour to about 4 hours. Further heating can be carried out according to a schedule that heats the array with the components at a temperature in the range of about 300° C. to about 600° C. for a period of about 1 hour to about 12 hours and subsequently heats the array with the components at a second temperature in the range of about 600° C. to about 1200° C. for a period of about 1 minute to about 24 hours. The rate of heating is generally in the range of about 1–10° C./minute or in other embodiments at a rate of 1–3° C./minute. Optionally or additionally, rapid thermal annealing can be used for the heat treating step(s) where heating rates can be as high as 1000° C. per minute or greater. For example, after calcining, rapid thermal annealing is typically used to crystallize the members of the array. One advantage is that rapid thermal annealing minimizes diffusion between the substrate and members of the array.

As such, using the methods of the present invention, the following materials can be prepared: covalent network solids, ionic solids and molecular solids. More particularly, the methods of the present invention can be used to prepare, for example, inorganic materials, intermetallic materials, metal alloys, ceramic materials, composite materials (e.g., inorganic composites, organic composites, or combinations thereof), etc. High-temperature superconductors can be prepared, for instance, by delivering reactant components to predefined regions on the substrate using, for example, solution based delivery techniques. Once the components of interest have been delivered to the substrate, the substrate is heated to the boiling point of the solvent to evaporate off the solvent. Alternatively, the solvent can be removed by delivering the reactant components to a heated substrate. The substrate is then oxidized to remove unwanted components (e.g., carbon, nitrogen, etc.) from the array. The substrate is then flash heated at a temperature of about 800° C. to about 875° C. for about two minutes. Thereafter, the reaction is rapidly quenched and the array is scanned for materials that are superconducting. Magnetic materials can be prepared using a similar process except that in the case of magnetic materials, the components are delivered to the substrate and simultaneously -reacted thereon in the presence of a magnetic field. Moreover, an array of zeolites, i.e., hydrated silicates of aluminum and either sodium, calcium or both, can be prepared using the methods of the present invention. To prepare an array of such materials, the reactant components are delivered to predefined regions on a substrate in the form of a slurry. Using a low temperature (e.g., 60° C. to about 70° C.) hydrothermal method, for example, the zeolites will crystallize out of solution.

It will be readily apparent to those of skill in the art that the foregoing synthetic routes are intended to illustrate, and not restrict, the ways in which the reactants can be simultaneously reacted to form at least two materials on a single substrate. Other synthetic routes and other modifications known to and used by those of skill in the art can also be used.

These combinatorial arrays lend themselves to the testing of diverse properties. Properties that one can test for include photoluminescence, electroluminescence, cathodoluminescence, x-ray luminescence, catalysis, superconductivity, magnetoresistive properties, magneto-optical properties, thermoelectric, dielectric and the like. Arrays of materials may be screened for more than one property.

EXAMPLES

The starting reagents were purchased from commercial sources and used as received unless otherwise noted. Some alkoxide components were handled in an argon or nitrogen inert atmosphere glove box (from Vacuum Atmospheres). However, the techniques of this invention generally allow the synthesis and manipulation of these components in air.

Example 1

The following is an example of the synthesis of a combinatorial library to explore the luminescent properties in the ternary borate system $(Y,Gd,La)BO_3:Eu$ (2 mol %) as the ratios of Y:Gd:La are varied with respect to each other. FIG. 1 is a flow chart of this example, such that FIG. 1 can be followed by reading this example.

Preparation of Stock Metal Alkoxide Solutions 3 solutions each of yttrium isopropoxide (0.833 g; $3.13 \times 10^{-3}$ mol), gadolinium isopropoxide (1.063 g; $3.17 \times 10^{-3}$ mol) and lanthanum isopropoxide (1.019 g; $3.22 \times 10^{-3}$ mol) are individually refluxed in 2-methoxyethanol (7.0 ml each) for 6 hours in an argon atmosphere. The lanthanum stock solution also contained 2,4-pentandione (0.161 g; $1.61 \times 10^{-3}$). The refluxed solutions are transferred to individual volumetric flasks (10.0 ml) and to each solution is further added 2-methoxyethanol to bring the total volume to 10.0 ml. Boric acid, $H_3BO_3$ (0.188 g; $3.05 \times 10^{-3}$ mol) is dissolved with sonication at room temperature in 2-methoxyethanol (total vol=10.0 ml)

Preparation of Components

The components are prepared using the stock solutions described above. Component 1 contains 0.799 ml of yttrium isopropoxide ($2.5 \times 10^{-4}$ mol) in 2-methoxyethanol to which is added triethanolamine (0.0187 g; $1.25 \times 10^{-4}$ mol) and further diluted with 2-methoxyethanol (0.184 ml). Component 2 contains 0.789 ml of gadolinium isopropoxide ($2.5 \times 10^{-4}$ mol) in 2-methoxyethanol to which is added triethanolamine (0.0187 g; $1.25 \times 10^{-4}$ mol) and further diluted with 2-methoxyethanol (0.195 ml). Component 3 contains 0.799 ml of lanthanum isopropoxide ($2.5 \times 10^{-4}$ mol) in 2-methoxyethanol to which is added triethanolamine (0.0748 g; $1 \times 10^{-3}$ mol) and further diluted with 2-methoxyethanol (0.158 ml). Component 4 contains 2.459 ml of boric acid ($7.5 \times 10^{-4}$ mol) in 2-methoxyethanol to which is added triethanolamine (0.0561 g; $3.75 \times 10^{-4}$ mol) and further diluted with 2-methoxyethanol (0.492 ml). Component 5 contains europium (III) nitrate hexahydrate (0.11 g; $2.5 \times 10^{-4}$ mol) in 2methoxyethanol (1.0 ml). The five components are approximately 0.25M with respect to the metal.

Preparation of Component Mixtures for Library Deposition

The above five components were mixed to make component mixtures. Component 6 contains component 1 (0.98 ml), component 4 (1.0 ml) and component 5 (0.02 ml) giving a solution with 0.98 parts Y, 1 part B and 0.02 parts Eu. Component 7 contains component 2 (0.98 ml), component 4 (1.0 ml) and component 5 (0.02 ml) giving a solution with 0.98 parts Gd, 1 part B and 0.02 parts Eu. Component 8 contains component 3 (0.98 ml), component 4 (1.0 ml) and component 5 (0.02 ml) giving a solution with 0.98 parts La, 1 part B and 0.02 parts Eu. To component mixture solutions 6, 7, 8 was further added anhydrous ethylene glycol (0.3 ml).

Automated Synthesis of Combinatorial Array in Microtiter Plates

The desired nominal stiochiometry was achieved through the use of dispensing gradients of the three individual component mixtures 6, 7 and 8. In this example the combinatorial array is first created in microtiter plates using automated solution dispensing. The polypropylene microtiter plates contain 8 rows×12 columns wherein each of the 96 regions in the array is physically separated and has a volume capacity of 300 μl per region. Using an automated liquid dispensing system, the ternary compositional space was constructed. Component mixtures 6, 7 and 8 are deposited in the triangular array such that the volumetric ratios of components 6:7:8 reflect the ratios as shown in Table 2, above, for components A:B:C such that after deposition 40 μl of solution was present in each of 66 wells for the purpose of creating an 11×11×11 (66 regions) triangular matrix. To ensure intimate mixing of the components in each region, a gentle stream of argon is used to agitate each well.

Preparation of Combinatorial Arrays on Silicon Substrate

For high temperature processing each component mixture in the microtiter plate (e.g., the array) is transferred to a region on a suitably treated substrate. In this example the substrate was a silicon wafer (3" diameter) that was chemically modified with an organosilane layer, such as $CH_3(CH_2)_nSiCl_3$ where $0 \leq n \leq 17$. The organosilane reagent was chosen to lend particular wetting characteristics to the substrate surface. The substrate was sonicated for 15–20 minutes in isopropanol, rinsed with distilled and de-ionized water, dried under a nitrogen gas jet and heated at 120° C. for about 20–30 minutes. After cooling, the substrate was placed in a 5% v/v solution of octyltrichlorosilane in methylene chloride, then removed from the methylene chloride, washed with methanol, then dried under a nitrogen gas jet. This entire process was repeated once by first reimmersing the substrate in the octyltrichlorosilane/methylene chloride solution. After the substrates were chemically modified through silanization, an array of regions was created by bead blasting the substrate with 50 μm alumina grit through a stainless steel mask which consisted of an array of 12×12 holes each 3.0 mm diameter with a center to center spacing of 4.0 mm. The substrate was bead blasted for enough time to remove about 4–6 μm of material from the silicon substrate. After bead blasting, the silicon wafer was a plurality of round 3 mm diameter slightly roughened regions with sufficient spacing so that the materials between regions would not intermix. The presence of the silane layer in the regions of the wafer that was not bead blasted ensured confinement of the component solutions in each region.

The combinatorial array on the microtiterplates was recreated on the silicon substrate by manually pipetting 2.2 μl of solution from each region in the microtiter plates to a corresponding region on the substrate. In total three substrates were created. On each substrate a redundant triangular matrix was also formed such that each triangle on a single substrate may be superimposed on each other by rotating by 180°.

Processing of Combinatorial Array

The substrates are covered for a period of approximately 24 hours after which the cover is removed and the samples allowed to dry in the ambient atmosphere for a further 24 hours. Each wafer is further processed in individual box furnaces. All substrates are first heated from room temperature to 120° C. at a rate of 1° C./min and maintained at that temperature for 2 hours followed by heating at 1° C./min to 180° C. maintaining that temperature for 2 hours. The samples are further heated to 500° C. for calcining at a rate of 2° C./min and maintaining that temperature for 6 hours. Sintering and crystallization of the arrays takes place by further heating to 800° C. for substrate 1, to 900° C. for substrate 2 and to 1000° C. for substrate 3 all at a rate of 3° C./min and maintaining at the elevated temperatures for 6 hours after which the samples are cooled to room temperature at a rate of 10° C./min.

Upon testing, red photoluminescence was observed from all of the regions in the library under short wavelength ($\lambda_{ex}$=254 nm) ultraviolet irradiation. The intensity of the luminescence was dependent on the ratio Y:Gd:La. Approximately the same luminescence intensity differences were observed for substrates 1, 2 and 3 except that the overall luminescence intensity was greatest for substrate 3.

Example 2

Oxide matrices can show visible luminescence if suitable activator ions are doped into the structure and then excited with, for example, ultraviolet (UV) light. One such material is yttrium aluminum garnet ($Y_3Al_5O_{12}$), which when doped with europium or terbium ions shows visible luminescence when excited with ultraviolet light in the 250 nm range. This example is an example of an 11×11 combinatorial array wherein the luminescent properties of an activator ion, europium, is evaluated in a yttrium aluminum garnet host with the following nominal stoichiometric composition $(Y_{1-x}Gd_x)_{3-z}(Al_{1-y}Ga_y)_5$:$Eu_z$ where x and y=0 to 1.0 in increments of 0.1 for all values of x and y, and z=0.06.

Four solutions each of yttrium isopropoxide (0.833 g; 3.13×10$^{-3}$ mol), gadolinium isopropoxide (1.063 g; 3.17×10$^{-3}$ mol), aluminum isopropoxide (0.622 g; 3.04×10$^{-3}$ mol) and gallium isopropoxide (1.281 g; 5.19×10$^{-3}$ mol) are individually refluxed in 2-methoxyethanol (7.0 ml each) for 6 hours in an argon atmosphere. The refluxed stock solutions are transferred to volumetric flasks (10.0 ml) and to each solution is further added 2-methoxyethanol to bring the total volume to 10.0 ml.

The following components are made from the stock solutions:

Component 1—yttrium isopropoxide (7.35×10$^{-4}$ mol), europium (III) nitrate hexahydrate (1.5×10$^{-5}$ mol) and triethanolamine (3.75×10$^{-4}$ mol) in 2-methoxyethanol (total vol=3.0 ml) giving a solution that contains 0.98 parts Y and 0.02 parts Eu;

Component 2—gadolinium isopropoxide (7.35×10$^{-4}$ mol), europium (III) nitrate hexahydrate (1.5×10$^{-5}$ mol) and triethanolamine (3.75×10$^{-4}$ mol) in 2-methoxyethanol (total vol=3.0 ml) giving a solution that contains 0.98 parts Gd and 0.02 parts Eu;

Component 3—aluminum isopropoxide (1.25×10$^{-3}$ mol) and triethanolamine (6.25×10$^{-4}$ mol) in 2-methoxyethanol (total vol=5.0 ml) giving a solution that contains 1 part Al; and Component 4—gallium isopropoxide (1.25×10$^{-3}$ mol) and triethanolamine (6.25×10$^{-4}$ mol) in 2-methoxyethanol (total vol=5.0 ml) giving a solution that contains 1 part Ga.

To each of components 1 and 2 is added ethylene glycol (0.45 ml). And to components 3 and 4 is added ethylene glycol (0.75 ml).

The desired nominal stoichiometry was achieved through the use of dispensing gradients of the component mixtures in two microtiter plates using automated solution dispensing. Component 1 was deposited in the array such that the volume of component 1 in each region (row #, column #, where row 1, column 1 is the top left region of the array) satisfied the relationship Vol (µl)=30−3(column#)+3. Component 2 was deposited in the array such that volume of component 2 in each region (row #, column #) satisfied the relationship Vol (µl)=3(column#)−3. Component 3 was deposited in the array such that volume of component 3 in each region (row #, column #) satisfied the relationship Vol (µl)=50−5(row#)+5. Component 4 deposited in the array such that volume of component 4 in each region (row #, column #) satisfied the relationship Vol (µl)=5(row#)−5. After the automated dispensing the total volume in each of the 11×11 regions in the array=80 µl. The nominal stoichiometry of the array can be described by the following, $(Y_{1-x}Gd_x)_{3-z}(Al_{1-y}Ga_y)_5$:$Eu_z$ where x and y=0 to 1.0 in increments of 0.1 for all the values of x and y, and z=0.06.

The 11×11 regions are recreated on three individual silicon substrates (12×12 array) by pipetting 2.2 µl onto each corresponding region on the silicon substrates from the microtiterplates. The substrates were prepared as in Example 1.

Processing of the substrates (arrays) took place in a box furnace in air. The arrays were heated from room temperature at a rate of 1° C./min to 120° C. and maintained at that temperature for 2 hours followed by heating at 1° C./min to 180° C., holding for 2 hours then heated at 1° C./min to 500° C., held for 6 hours followed by heating to 1100° C. at 2° C./min and holding for 3 hours after which the substrates are cooled to room temperature at the natural cooling rate of the furnace.

Upon testing, red photoluminescence was observed from all of the regions in the library under short wavelength ($\lambda_{ex}$=254 nm) ultraviolet irradiation. The intensity of the luminescence was dependent on the region of the library.

Example 3

In the following example of a combinatorial array, the potential luminescent properties of host oxide matrices based on ternary compositional space variations in (GdV, GdTa, GdP) and (GdV, GdNb, GdP) are explored.

Gadolinium isoproxide, vanadyl triisopropoxide and tantalum ethoxide stock solutions were prepared in 2-methoxyethanol in the manner described above for examples 1 and 2. Niobium ethoxide was refluxed in 2-methoxyethanol in a similar manner, but it also contained 1 mole equivalent of 2,4-pentanedione. A phosphorous stock solution was made from $P_2O_5$ (1.951 g, 6.87×10$^{-3}$ mol) in a round bottom flask to which was slowly added 2 methoxyethanol (20 ml) at 0° C. with stirring in an argon atmosphere. After warming to room temperature, the solution was refluxed for 2 hrs.

The following component mixtures were made from the above mentioned stock solutions as described in example 1:

Component 1—gadolinium isopropoxide (1.0×10$^{-3}$ mol) and triethanolamine (5.0×10$^{-3}$ mol) in 2-methoxyethanol (total vol=4.0 ml);

Component 2—phosphorous pentoxide (1.25×10$^{-4}$ mol) and triethanolamine (1.25×10$^{-4}$ mol) in 2-methoxyethanol (total vol=1.0 ml);

Component 3—niobium ethoxide (2.5×10$^{-4}$ mol) and 2,4-pentanedione (2.5×10$^{-4}$), triethanolamine (1.25×10$^{-4}$ mol) in 2-methoxyethanol (total vol=1.0 ml);

Component 4—vanadyl triisopropoxide ($2.5\times10^{-4}$ mol) and 2,4-pentanedione ($2.5\times10^{-4}$ mol) in 2-methoxyethanol (total vol=1.0 ml);

Component 5—tantalum ethoxide ($2.5\times10^{-4}$ mol) and triethanolamine ($1.25\times10^{-4}$ mol) in 2-methoxyethanol (total vol=1.0 ml);

Component 6—component 1 (1.0 ml) and component 4 (1.0 ml) giving a solution 1 part Gd to 1 part V;

Component 7—component 1 (1.0 ml) and component 5 (1.0 ml) giving a solution 1 part Gd to 1 part Ta;

Component 8—component 1 (1.0 ml) and component 2 (1.0 ml) giving a solution 1 part Gd to 1 part P; and Component 9—component 1 (1.0 ml) and component 3 (1.0 ml) giving a solution 1 part Gd to 1 part Nb.

To each of component mixtures 6, 7, 8 and 9 was added anhydrous ethylene glycol (0.3 ml).

Using automated solution dispensing an 11×11 array was created in microtiterplates where the dispensed volumes of components 6:7:8:9 are in the ratios shown in Table 4, above, for A:B:C:D respectively. The total volume in each region is constant at 40 µl. The array in the microtiter plates is recreated on three separate silicon wafers that had been silanized and bead blasted in an identical manner to that described in example 1. 2.2 µl is from each of the 11×11 regions on the microtiter plates is manually pipetted onto each corresponding region on the wafer. Processing of the three wafers is identical to that reported for processing conditions in example 1.

Upon testing, intense blue photoluminescence was observed with short wavelength ($\lambda_{ex}$=254 nm) illumination from regions of the array, particularly in the regions where there is present large proportions of $GdPO_4$—$GdVO_4$. PXRD shows formation of a $GdVO_4$ phase on the vanadium rich portion and a $GdPO_4$ phase on the phosphorous rich portion.

Example 4

In the following example of a combinatorial array, the potential luminescent properties of host oxide matrices based on ternary compositional space variations in (GdV, GdTa, GdP) and (GdV, GdNb, GdP) are explored as a function of a deliberately added activator ion, europium.

From example 3, after creation of the combinatorial array on three substrates, using automated dispensing, to all 11×11 regions in the two microtiterplates is added 2.0 µl from a solution of europium (III) nitrate hexahydrate (0.009 g) dissolved in 2-methoxyethanol (1.0 ml). This corresponds to a Eu doping at a level approximately 1.1 mol % w.r.t. Gd, which is constant over the entire array. After agitating each region with a gentle stream of gas, the array on the microtiterplates is recreated on three individual silicon substrates in an identical manner to that reported in the previous example. The wafers are treated and processed identically as described in example 3.

Upon testing, red luminescence was observed from a large number of regions in the array under short wavelength illumination. The most intense luminescence was observed from those regions that showed blue photoluminescence in the previous examples.

Example 5

In this example a combinatorial array is synthesized wherein the effect of the doping concentration of terbium ions in a gadolinium containing matrix ($Gd_{1-x}Tb_x$(x=0 to 0.1 in increments of 0.01 and x=0 to 0.01 in increments of 0.001 and x=0 to 0.001 in increments of 0.0001)) is evaluated for an array processed in an oxidizing environment, a sulfiding environment and in a reducing atmosphere. In this example, processing of the array in $H_2S$ allows for the formation of the gadolinium oxysulfide, the S source being derived from the processing environment.

A stock solution was prepared from gadolinium isopropoxide in 2-methoxyethanol in a manner similar to that reported in examples 1 and 2. The components were made in a similar manner to those in example 1:

Component 1—gadolinium isopropoxide ($1.25\times10^{-3}$ mol) and triethanolamine ($1.25\times10^{-3}$ mol) in 2 methoxyethanol (total volume=5.0 ml);

Component 2—terbium (III) nitrate hexahydrate (0.108 g; $2.5\times10^{-4}$ mol) dissolved in 2-methoxyethanol (1.0 ml) at room temperature;

Component 3—component 1 (0.9 ml) and component 2 (0.1 ml) giving a solution 0.9 parts Gd to 0.1 parts Tb;

Component 4—component 1 (0.99 ml) and component 2 (0.01 ml) giving a solution 0.99 parts Gd to 0.01 parts Tb; and Component 5—component 1 (0.999 ml) and component 2 (0.001 ml) giving a solution 0.999 parts Gd to 0.001 parts Tb.

To each of components 3, 4 and 5 is added ethylene glycol (0.15 ml).

Using automated solution dispensing 3 rows of 11 regions per row are created in a microtiter plate. In row 1, components 5 and 1 are dispensed in volume ratios corresponding to the ratios shown in Table 1, above, for components A:B respectively. In row 2, components 4 and 1 are dispensed similar to row 1. In row 3, components 3 and 1 are dispensed in gradients similar to row 1. This effectively creates the nominal composition of $Gd_{1-x}Tb_x$(x=0.1 to 0 in decrements of 0.01) in row 3, $Gd_{1-x}Tb_x$(x=0.01 to 0 in decrements of 0.001) in row 2 and $Gd_{1-x}Tb_x$(x=0.001 to 0 in decrements of 0.0001) in row 1.

After mixing each region as described in example 1, 2.0 µl from each region is transferred to the corresponding region on each of three silicon substrates (12×12 array) prepared as in example 1. On each substrate the deposition of the three rows is repeated a further three times giving four copies of the three rows on each of three substrates (called Substrates 1, 2 and 3).

The substrates are processed in a manner similar to that reported in example 1 except that after calcination at 400° C. for 6 hours instead of 500° C., the substrates are then allowed to cool to room temperature.

Differing Atmospheres

Substrate 1 was treated in a tube furnace in a sulfiding atmosphere. In flowing argon (60 cc/min), the substrate was heated from room temperature to 500° C. at a rate of 10° C./min. When the temperature reached 400° C., the gas feed was changed to $Ar/H_2S$ (50:50) flowing at 60 cc/min. A temperature of 500° C. was maintained for 0.25 hrs followed by heating to 800° C. at a rate of 10° C./min with the flowing $Ar/H_2S$. The furnace was maintained at 800° C. for 1.5 hrs then cooled to room temperature at 10° C./min in the flowing $Ar/H_2S$. Upon testing, green luminescence was observed from all regions of the array that contained terbium under short wavelength ($\lambda_{ex}$=254 nm) illumination. A gradient of luminescence intensity was observed and peaked in the regions where x=0.008 to 0.03. Powder X-ray diffraction (PXRD) from row 1 in the array indicated that all regions contained predominantly $Gd_2O_2S$. At higher terbium concentration as in row 3 there was evidence of minor phases corresponding to $Tb_2O_2S$.

Substrate 2 was heated in a box furnace in air to 800° C. at a rate of 10° C./min and maintained at the elevated temperature for 6 hrs, then cooled to room temperature at 10° C./min. Upon testing, extremely weak green photoluminesence ($\lambda_{ex}$=254 nm) was observed from regions of the library containing terbium. A gradient of brown coloration was noted as the level of terbium with respect to gadolinium increased especially in row 3 (and redundant rows 6, 9 and 12). This is ascribed primarily to the presence of terbium 4+ ions in the matrix which was predominantly $Gd_2O_3$ as evidenced by PXRD.

Substrate 3 was heated in a tube furnace from room temperature to 800° C. at a rate of 10° C./min, maintained at the elevated temperature for 6 hrs, then cooled to room temperature at a rate of 10° C./min in a flowing forming gas mixture (Ar/6% $H_2$). Upon testing, green photoluminescence was observed from all regions in the array containing terbium. As with substrate 1 a gradient of luminescence intensity was noted with a maximum in those regions corresponding to x=0.008 to 0.03. PXRD showed the predominant phase to be $Gd_2O_3$.

Example 6

The following is an example of a combinatorial library to explore the luminescent properties of compositional space variations in the oxide matrix $(Y_{1-x}Gd_x)_{1-y-x}BO_3:Eu_yBi_z$ where y and z run in perpendicular gradients and are=0 to 0.03 in increments of 0.006 for values of x=0.1, 0.2, 0.4 and 0.6 respectively.

Stock solutions are prepared in 2-methoxyethanol starting from gadolinium isopropoxide, yttrium isopropoxide and boric acid as described in example 1. The following components are made up in a similar manner as described in example 1.

Component 1—yttrium isopropoxide ($1.5 \times 10^{-3}$ mol) and triethanolamine ($7.5 \times 10^{-4}$ mol) in 2-methoxyethanol (total vol=6.0 ml);

Component 2—gadolinium isopropoxide ($1.25 \times 10^{-3}$ mol) and triethanolamine ($6.25 \times 10^{-4}$ mol) in 2-methoxyethanol (total vol=5.0 ml);

Component 3—boric acid ($1.25 \times 10^{-3}$ mol) and triethanolamine ($6.25 \times 10^{-4}$ mol) in 2-methoxyethanol (total vol=5.0 ml);

Component 4—europium (III) nitrate hexahydrate (0.111 g, $2.5 \times 10^{-4}$ mol) dissolved in 2-methoxyethanol (1.0 ml);

Component 5—Bismuth (III) nitrate pentahydrate (0.121 g, $2.5 \times 10^{-4}$ mol) dissolved in 2-methoxyethanol (1.0 ml);

Component 6—component 1 (1.8 ml) and component 2 (0.2 ml) giving a solution 0.9 parts in Y to 0.1 parts Gd;

Component 7—component 1 (1.6 ml) and component 2 (0.4 ml) giving a solution 0.8 parts in Y to 0.2 parts Gd;

Component 8—component 1 (1.2 ml) and component 2 (0.8 ml) giving a solution 0.6 parts in Y to 0.4 parts Gd;

Component 9—component 1 (0.8 ml) and component 2 (1.2 ml) giving a solution 0.4 parts in Y to 0.6 parts Gd;

Component 10—component 6 (0.750 ml) and component 3 (0.750 ml) and ethylene glycol (0.225 ml) giving a solution 1 parts ($Y_{0.9}Gd_{0.1}$) to 1 parts B;

Component 11—component 6 (0.470 ml), component 3 (0.5 ml), component 4 (0.030 ml) and ethylene glycol (0.15 ml) giving a solution 0.94 parts ($Y_{0.9}Gd_{0.1}$) to 1 parts B to 0.06 parts Eu;

Component 12—component 6 (0.470 ml), component 3 (0.5 ml), component 5 (0.030 ml) and ethylene glycol (0.15 ml) giving a solution 0.94 parts ($Y_{0.9}Gd_{0.1}$) to 1 parts B to 0.06 parts Bi;

Component 13—component 7 (0.750 ml), component 3 (0.750 ml) and ethylene glycol (0.225 ml) giving a solution 1 parts ($Y_{0.8}Gd_{0.2}$) to 1 parts B;

Component 14—component 7 (0.470 ml), components 3 (0.5 ml), component 4 (0.030 ml) and ethylene glycol (0.15 ml) giving a solution 0.94 parts ($Y_{0.8}Gd_{0.2}$) to 1 parts B to 0.06 parts Eu;

Component 15—component 7 (0.470 ml), component 3 (0.5 ml), component 5 (0.030 ml) and ethylene glycol (0.15 ml) giving a solution 0.94 parts ($Y_{0.8}Gd_{0.2}$) to 1 parts B to 0.06 parts Bi;

Component 16—component 8 (0.750 ml), component 3 (0.750 ml) and ethylene glycol (0.225 ml) giving a solution 1 parts ($Y_{0.6}Gd_{0.4}$) to 1 parts B;

Component 17—component 8 (0.470 ml), component 3 (0.5 ml), component 4 (0.030 ml) and ethylene glycol (0.15 ml) giving a solution 0.94 parts ($Y_{0.6}Gd_{0.4}$) to 1 parts B to 0.06 parts Eu;

Component 18—component 8 (0.470 ml), component 3 (0.5 ml), component 5 (0.030 ml) and ethylene glycol (0.15 ml) giving a solution 0.94 parts ($Y_{0.6}Gd_{0.4}$) to 1 parts B to 0.06 parts Bi;

Component 19—component 9 (0.750 ml), component 3 (0.750 ml) and ethylene glycol (0.225 ml) giving a solution 1 parts ($Y_{0.4}Gd_{0.6}$) to 1 parts B;

Component 20—component 9 (0.470 ml), component 3 (0.5 ml), component 4 (0.030 ml) and ethylene glycol (0.15 ml) giving a solution 0.94 parts ($Y_{0.4}Gd_{0.6}$) to 1 parts B to 0.06 parts Eu; and Component 21—component 9 (0.470 ml), component 3 (0.5 ml), component 5 (0.030 ml) and ethylene glycol (0.15 ml) giving a solution 0.94 parts ($Y_{0.4}Gd_{0.6}$) to 1 parts B to 0.06 parts Bi.

Using automated solution dispensing components 10, 11 and 12 are dispensed in a microtiter plate creating a 6×6 array such that the ratios of the volumes of each components 10:11:12 is identical to that shown in Table 6, above, for component A:B:C respectively. The total volume of all components in each individual region=60 µl. The nominal stoichiometric relationship in this array is thus represented by $(Y_{0.9}Gd_{0.1})_{1-y-z}B:Eu_y,Bi_z$ where y and z run in perpendicular gradients from the upper left region in values 0 to 0.03 in increments of 0.006.

A similar 6×6 array is created in different regions but on the same microtiter plate as for components 13, 14 and 15 using the identical dispensing gradients as shown above. The nominal stoichiometric relationship in this array is thus represented by $(Y_{0.8}Gd_{0.2})_{1-y-z}B:Eu_y,Bi_z$ where y and z run in perpendicular gradients from the upper left region in values 0 to 0.03 in increments of 0.006.

A similar 6×6 array is created in a second microtiter plate for components 16, 17 and 18 using the identical dispensing gradients as shown above. The nominal stoichiometric relationship in this array is thus represented by $(Y_{0.6}Gd_{0.4})_{1-y-z}B:Eu_y,Bi_z$ where y and z run in perpendicular gradients from the upper left region in values 0 to 0.03 in increments of 0.006.

A similar 6×6 array is created in different regions but on the same second microtiter plate as for components 19, 20 and 21 using the identical dispensing gradients as shown above. The nominal stoichiometric relationship in this array is thus represented by $(Y_{0.4}Gd_{0.6})_{1-y-z}B:Eu_y,Bi_z$ where y and z run in perpendicular gradients from the upper left region in values 0 to 0.03 in increments of 0.006.

The four 6×6 arrays in the microtiterplates are recreated on a silicon wafer (prepared as in example 3) giving 12×12 regions where 2.2 µl from each region on the microtiter plate is transferred to a corresponding region on the silicon wafer. This process is repeated for two more silicon substrates giving three identical arrays. The processing of the three combinatorial arrays takes place as described in example 3, where substrate 1 is heated to 800° C., substrate 2 to 900° C. and substrate 3 to 1000° C.

Upon testing under short wave ($\lambda_{ex}$=254 nm) ultraviolet illumination, red photoluminescence is observed from all of those regions that contained europium. Weaker blue luminescence was observed from only those regions that contained bismuth and not europium. The intensity of the red photoluminescence was greatest in those regions that contained both europium and bismuth ions.

Example 7

The following is an example of the synthesis of a 12×11 combinatorial array explore the effect of potential luminescent activator ions in a Ba—Al—Ga containing matrix, where the nominal stoichiometry can be represented by $Ba(Ga_{1-x}Al_x)_2$ where x=0 to 1.0 in increments of 0.1.

Stock solutions of barium isopropoxide, gallium isopropoxide and aluminum isopropoxide were prepared in 2-methoxyethanol in a manner similar to that reported for the stock solutions in example 1. From the stock solutions the following component mixtures are made:

Component 1—barium isopropoxide($7.5 \times 10^{-4}$ mol) and triethanolamine ($3.75 \times 10^{-4}$ mol) in 2-methoxyethanol (total vol=3 ml);

Component 2—gallium isopropoxide ($7.5 \times 10^{-4}$ mol) and triethanolamine ($3.75 \times 10^{-4}$ mol) in 2-methoxyethanol (total vol=3 ml); and Component 3—aluminum isopropoxide ($7.5 \times 10^{-4}$ mol) and triethanolamine ($3.75 \times 10^{-4}$ mol) in 2-methoxyethanol (total vol=3 ml).

Components 4, 5, 6, 7, 8, 9, 10, 11, 12, 13 and 14 contain, respectively, indium (III) nitrate pentahydrate (0.0097 g, $2.5 \times 10^{-5}$ mol), bismuth (III) nitrate pentahydrate (0.0121 g, $2.5 \times 10^{-5}$ mol), lead (II) nitrate (0.0083 g, $2.5 \times 10^{-5}$ mol), antimony (III) n-butoxide (0.0085 g, $2.5 \times 10^{-5}$ mol), thallium (III) nitrate trihydrate (0.0111 g, $2.5 \times 10^{-5}$ mol), ytterbium (III) nitrate pentahydrate (0.0112 g, $2.5 \times 10^{-5}$ mol), cerium (III) nitrate hexahydrate (0.0108 g, $2.5 \times 10^{-5}$ mol), dysprosium (III) nitrate pentahydrate (0.0109 g, $2.5 \times 10^{-5}$ mol), samarium (III) nitrate hexahydrate (0.0111 g, $2.5 \times 10^{-5}$ mol), europium (III) nitrate hexahydrate (0.0111 g, $2.5 \times 10^{-5}$ mol), terbium (III) nitrate pentahydrate (0.0108 g, $2.5 \times 10^{-5}$ mol) each dissolved in 2-methoxyethanol (1.0 ml each).

Component 15—component 1 (1.5 ml), component 2 (3.0 ml) and ethylene glycol (0.675 ml) giving a solution 1 part in Ba and 2 part in Ga.

Component 16—component 1 (1.5 ml), component 3 (3.0 ml) and ethylene glycol (0.675 ml) giving a solution 1 part in Ba and 2 part in Al.

Using automated solution dispensing components 15 and 16 are dispensed creating 12 identical rows of 11 regions in each row where the ratios of the volumes dispensed in each row for component 15:16 are identical to that shown in Table 1, above, for components A:B. The total volume in each region after the deposition is 30 µl. This satisfies the nominal stoichiometric relationship $Ba(Ga_{1-x}Al_x)$ where x=0 to 1.0 in increments of 0.1 for each of 12 rows. To each of the 11 regions in row 1 was added component 4 (2.0 µl). The dopant concentration is approximately 2.3 mol % w.r.t. Ba in each region. This deposition was repeated for rows 2 to 11 using components 5 to 14 respectively. Row 12 does not contain any deliberately added dopant. Three identical copies of the array were made on three silicon substrates wherein 2.2 µl is transferred from each region on the microtiterplates to a corresponding region on three silicon substrates (called substrate 1, substrate 2 and substrate 3).

Substrate 1 is heated and calcined as described in example then sintered in air at 800° C. Upon testing, strong visible photoluminescence ($\lambda_{ex}$=254 nm) was observed from regions of the array that contain Pb, Eu, Tb. Powder X-ray diffraction from row 1 indicates that the upper left region consisted predominately of the $BaGa_2O_4$ phase whereas the last region in the row consisted of $BaAl_2O_4$. The regions in between showed single phases of the solid solution $Ba(Ga_{1-x}Al_x)_2O_4$ existed.

Substrate 2 is heated and calcined to 400° C. in air as similarly described in example 1. After cooling to room temperature the substrate is further heated in a tube furnace with flowing forming gas ($N_2$/6.0% $H_2$) at 100 cc /min from room temperature to 1000° C. at a rate of 10° C./min and maintaining at the elevated temperature for 3 hours.

Upon testing, only visible photoluminescence ($\lambda_{ex}$=254 nm) was observed from the $1^{st}$ three regions in the row that was doped with Eu. PXRD indicated the predominant phase to be $Ba_2Ga_2O_5$ which decreases across the row with the $BaAl_2O_4$ phase growing in. All regions are mixed phase.

Substrate 3 is heated and calcined to 400° C. in air as similarly described in example 1. After cooling to room temperature the substrate is further heated in a tube furnace with flowing $Ar/H_2S$ 50:50 at 60 cc/min from room temperature to 800° C. at a rate of 10° C./min and maintaining at the elevated temperature for 1.5 hours. Upon testing, weaker blue/green photoluminescence ($\lambda_{ex}$=254 nm) was observed from the $1^{st}$ regions on the Eu. PXRD indicates the predominant phase where luminescence is observed to be $BaGa_2S_4$.

Example 8

The following is an example of the synthesis of a combinatorial library to explore the ternary cerate system (Ca, Sr,Ba)$_2$CeO$_4$ as the ratios of Ca, Sr, and Ba are varied with respect to each other.

A library of (Ca,Sr,Ba)$_2$CeO$_4$ was prepared using the same general method as that described in example 1. The silicon substrate was prepared in the same fashion as that described in example 1. Component solutions were prepared by dissolving strontium isopropoxide (0.628 g, 3.05 mmol, in 9.85 ml 2-methoxyethanol) (component 1), barium isopropoxide (1.04 g, 4.07 mmol, in 10.03 ml 2-methoxyethanol) (component 2) and cerium isopropoxide (1.04 g, 2.38 mmol, in 8.04 ml 2-methoxyethanol) (component 3), and subsequently heating under reflux conditions for 8 hours in an argon atmosphere. As-purchased calcium methoxyethoxide (20%) in methoxyethanol (2.86 ml, 3.00 mmol) was diluted by a further addition of 2-methoxyethanol (7.14 ml) (component 4).

To 2.0 ml of component 1, triethanolamine (0.029 g, 0.19 mmol) was added with stirring followed by ethylene glycol (0.36 ml) and additional 2-methoxyethanol (0.41 ml). To 2.0 ml of component 2, triethanolamine (0.04 g, 0.27 mmol) was added with stirring followed by ethylene glycol (0.49 ml) and additional 2-methoxyethanol (1.24 ml). To 2.0 ml of component 3, triethanolamine (0.09 g, 0.59 mmol) was added with stirring followed by ethylene glycol (0.36 ml) and additional 2-methoxyethanol (0.37 ml). To 2.0 ml of component 4, triethanolamine (0.03 g, 0.20 mmol) was added with stirring followed by ethylene glycol (0.36 ml) and additional 2-methoxyethanol (0.40 ml).

Using automated solution dispensing, volumes of each component were dispensed into a 96-well microtiter plate in ratios such that a total of 75 µl of component solutions were present in each of 66 wells for the purpose of creating an 11×11×11 triangular matrix of (Ca,Sr,Ba)$_2$CeO$_4$. Component 3 (25 µl) was deposited into each of the 66 wells. At each apex, 50 µl of components 1, 2 and 4 were deposited, respectively. Depositions of each alkaline earth component solution (1, 2 and 4) were decremented in units of 10%, i.e. 5 µl, from each apex resulting in metal ratios of 2Ca:Ce, 2Sr:Ce and 2Ba:Ce at the three corners of the triangle while maintaining a total volume of 75 μl of solution per well. The percent of the 50 μl in each well attributable to components 1, 2, and 4, respectively, are listed in Table 2, above.

To insure adequate mixing, the microtiter plate was placed on an agitator table for minutes. 2.2 μl of each well was then manually transferred onto each region of the pretreated silicon substrate. The library was allowed to gel under ambient conditions. After gelation, the library was gradually dried and calcined through a heating cycle consisting of slow (1.0° C./minute) ramping followed by 2 hours at 120° C., 1° C./minute ramp and 2 hours at 180° C., 1° C./minute and 6 hours at 500° C. and 2° C./minute and 6 hours at 900° C. Further heat treatment was performed depending on phase purity as seen by PXRD.

Example 9

A library of $Sr_{2-y}La_yCe_{1-x}Tb_xO_4$, $0 \leq x \leq 1$; $0 \leq y \leq 1$, was prepared using an alternative aqueous sol-gel method to that described in example 8.

Component solutions were prepared by dissolving strontium nitrate (0.106 g, 0.50 mmol)(component 1), lanthanum nitrate pentahydrate (0.208 g, 0.50 mmol)(component 2), cerium nitrate hexahydrate (0.217 g, 0.50 mmol)(component 3), and terbium nitrate hexahydrate (0.226 g, 0.50 mmol) (component 4) in 5.0 ml distilled, deionized water, respectively. Citric acid (0.480 g, 2.50 mmol) was added with stirring to each component solution such that the molar ratio of metal cation: citric acid was 1:5. After the complete dissolution of the citric acid, ethylene glycol (0.56 ml) was added with stirring to each component solution such that the molar ratio of metal cation : ethylene glycol was 1:20. Each solution was heated at 70° C. with stirring for 30 minutes. Silicon substrates were prepared as described in example 1.

Using automated solution dispensing, component solutions 1–4 were dispensed into 11×11 regions located in two microtiter plates. The desired nominal stoichiometry, $Sr_{2-y}La_yCe_{1-x}Tb_xO_4$, $0 \leq x \leq 1$; $0 \leq y \leq 1$, was achieved through the use of dispensing gradients of the component mixtures similar to that in Table 3, above, but that the total volume of A+B is equal to 2 times C+D. Components 1 and 2 were dispensed in opposing gradients such that $V_1+V_2=100$ μl; $V_2$=(row #−1)*5 μl. Components 3 and 4 were dispensed in opposing gradients such that $V_3+V_4=50$ μl; $V_4$=(column #−1)* 5 μl. The microtiter plates were covered and shaken on a mechanical shaker for 10 minutes to ensure good mixing. 2 μl from each region were transferred to each region on the silicon substrate such that the microtiter plate array was repeated on a single silicon wafer. The substrate was covered and allowed to dry under ambient conditions overnight. Processing of the substrate took place in a box furnace in air. The sample was heated from room temperature at a rate of 1° C./min. to 120° C. and maintained at that temperature for 2 hours followed by heating at 1° C./min. to 180° C., holding for 2 hours then heated at 1° C./min to 500° C., held for 6 hours followed by heating to 1100° C. at 2° C./min and holding for 3 hours after which the substrate is cooled to room temperature at the natural cooling rate of the furnace.

Examples 10 to 29

The following 20 examples are representative of a combinatorial discovery program of transition metal oxide composition spaces for use as heterogeneous catalysts in the dehydrogenation of alkanes. In these examples, the 20 possible ternary composition spaces of the group V and VI transition metals are described.

Example 10

In this example the composition space of V—Nb—Ta—O is studied for compositions from 0–100% for V, Nb, and Ta oxides.

Component solutions were prepared by dissolving vanadium triisopropoxide oxide (1.340 g/1.22 ml, 5.53 mmol in 9.72 ml 2-methoxyethanol) (component 1), niobium (V) ethoxide (1.759 g/1.60 ml, 5.53 mmol in 7.92 ml 2-methoxyethanol) (component 2), tantalum (V) ethoxide (2.154 g/1.96 ml, 5.30 mmol in 8.22 ml 2-methoxyethanol) (component 3) in 2-methoxyethanol. Acetylacetonate (0.554 g, 5.53 mmol; 0.562 g, 5.61 mmol; 0.530 g, 5.29 mmol, respectively) was added to each component with stirring. Each component was refluxed for 3 hours under an atmosphere of argon. To 3 ml of component 1, ethylene glycol (0.45 ml) and 2-methoxyethanol (0.06 ml) were added with stirring. To 3 ml of component 2, diethanolamine (0.581 g, 5.53 mmol), 2-methoxyethanol (0.29 ml), and ethylene glycol (0.45 ml) were added with stirring. To 3 ml of component 3, diethanolamine (0.557 g, 5.30 mmol) and ethylene glycol (0.45 ml) were added with stirring.

Using automated solution dispensing, volumes of each component were dispensed into a 96-well microtiter plate in ratios such that a total of 50 μl of component solutions were present in each of 66 wells for the purpose of creating an 11×11×11 triangular matrix of V—Nb—Ta—O. Components 1, 2, and 3 were deposited into each of the 66 wells using the compositional gradient illustrated in Table 2, above. At each apex, 50 μl of components 1, 2 and 3 were deposited, respectively. Depositions of each component solution (1, 2 and 3) were decremented in units of 10%, i.e. 5 μl, from each apex resulting in compositional variation from 100–0% for each component solution while maintaining a total volume of 50 μl of solution per well. The percent of the 50 μl in each well attributable to components 1, 2 and 3, respectively, are listed in Table 2, above. To ensure adequate mixing, solutions were agitated with a stream of $N_2$.

From each microtiter region, 3 μl were transferred to each region on the quartz substrate such that a triangular array was repeated on the quartz wafer. A redundant triangular array was also prepared on the quartz wafer such that each array could be superimposed after a 180° rotation. The quartz substrates were prepared in an analogous fashion to the silicon substrates described in example 1. The substrate was covered and allowed to dry under ambient conditions overnight. Thermal processing of the resulting library took place in air. The sample was heated from room temperature at a rate of 1° C./min. to 120° C. and maintained at that temperature for 2 hours followed by heating at 1° C./min. to 180° C., holding for 2 hours then heated at 1° C./min to 400° C., held for 8 hours after which the substrate is cooled to room temperature at the natural cooling rate of the furnace.

Examples 11–29 were prepared in the manner described for example 10 with the exception of the component solutions. Component solutions 1–3 for examples 11–29 are listed in Table 7, below. All solutions are prepared to approximately 0.5 M. If acetylacetonate is used as a modifying ligand, the addition is always before the application of reflux conditions. If diethanolamine is used as a modifying ligand, the addition is always after the application of reflux conditions. After refluxing and the addition of all modifying ligands, 3 ml of each component solution are diluted to constant concentration followed by the addition of ethylene glycol (0.45 ml). Transfers from the component solutions to the microtiter plate and subsequently to the substrate were performed as described in example 10. Thermal processing was performed as described in example 10.

TABLE 7

| Example | Composition space | Components | Component solutions for Examples 11–29 | | | |
|---|---|---|---|---|---|---|
| | | | Components | Acetylacetonate | Reflux time (hr) | Diethanolamine | Volume (ml) |

| Example | Composition space | Components | Components (amount) | Acetylacetonate | Reflux time (hr) | Diethanolamine | Volume (ml) |
|---|---|---|---|---|---|---|---|
| 11 | Cr—V—Nb—O | Chromium (III) 2-ethylhexanoate 35% (1)<br>Vanadium triisopropoxide oxide (2)<br>Niobium (V) ethoxide (3) | 6.924 g/6.29 ml (5.03 mmol)<br>1.320 g/1.20 ml (5.45 mmol)<br>1.759 g/1.60 ml (5.53 mmol) | 0.504 g, 5.03 mmol<br>0.546 g, 5.45 mmol<br>0.562 g, 5.61 mmol | 2<br>3<br>3 | 0.529 g, 5.03 mmol<br>—<br>1.163 g 11.06 mmol | 11.12<br>9.31<br>11.16 |
| 12 | Cr—W—V—O | Chromium (III) 2-ethylhexanoate 35% (1)<br>Tungsten (V) ethoxide (2)<br>Vanadium triisopropoxide oxide (3) | 6.924 g/6.29 ml (5.03 mmol)<br>2.052 g/1.87 ml (5.02 mmol)<br>1.340 g/1.22 ml (5.53 mmol) | 0.504 g, 5.03 mmol<br>0.538 g, 5.37 mmol<br>0.554 g, 5.53 mmol | 2<br>3<br>3 | 0.529 g, 5.03 mmol<br>0.528 g, 5.02 mmol<br>— | 11.12<br>11.24<br>11.51 |
| 13 | W—V—Ta—O | Tungsten (V) ethoxide (1)<br>Vanadium triisopropoxide oxide (2)<br>Tantalum (V) ethoxide (3) | 2.052 g/1.87 ml (5.02 mmol)<br>1.340 g/1.22 ml (5.53 mmol)<br>2.154 g/1.96 ml (5.30 mmol) | 0.538 g, 5.37 mmol<br>0.554 g, 5.53 mmol<br>0.530 g, 5.29 mmol | 3<br>3<br>3 | 0.528 g, 5.02 mmol<br>—<br>0.557 g, 5.30 mmol | 11.24<br>11.51<br>11.29 |
| 14 | Mo—Nb—Ta—O | Molybdenum(V)ethoxide (1)<br>Niobium (V) ethoxide (2)<br>Tantalum (V) ethoxide (3) | 3.409 g (10.61 mmol)<br>2.287 g/2.08 ml (7.19 mmol)<br>2.322 g/2.11 ml (5.72 mmol) | —<br>0.720 g, 7.19 mmol<br>0.592 g, 5.91 mmol | 2<br>2<br>2 | 1.116 g, 10.61 mmol<br>—<br>0.601 g, 5.72 mmol | 22.11<br>11.68<br>10.68 |
| 15 | Cr—Nb—Ta—O | Chromium (III) 2-ethylhexanoate 35% (1)<br>Niobium (V) ethoxide (2)<br>Tantalum (V) ethoxide (3) | 6.924 g/6.29 ml (5.03 mmol)<br>1.759 g/1.600 ml (5.53 mmol)<br>2.154 g/1.960 ml (5.30 mmol) | 0.504 g, 5.03 mmol<br>0.562 g, 5.61 mmol<br>0.530 g, 5.29 mmol | 2<br>3<br>3 | 0.529 g, 5.03 mmol<br>1.163 g 11.06 mmol<br>0.557 g, 5.30 mmol | 11.12<br>11.16<br>11.29 |
| 16 | Cr—W—Ta—O | Chromium (III) 2-ethylhexanoate 35% (1)<br>Tungsten (V) ethoxide (2)<br>Tantalum (V) ethoxide (3) | 6.924 g/6.29 ml (5.03 mmol)<br>2.494 g/2.27 ml (6.10 mmol)<br>2.322 g/2.11 ml (5.72 mmol) | 0.504 g, 5.03 mmol<br>—<br>0.592 g, 5.91 mmol | 2<br>2<br>2 | 0.529 g, 5.03 mmol<br>0.641 g, 6.10 mmol<br>0.601 g, 5.72 mmol | 11.12<br>11.94<br>10.68 |
| 17 | Mo—W—Ta—O | Molybdenum (V) ethoxide (1)<br>Tungsten (V) ethoxide (2)<br>Tantalum (V) ethoxide (3) | 3.409 g (10.61 mmol)<br>2.173 g/1.98 ml (5.31 mmol)<br>2.322 g/2.11 ml (5.72 mmol) | —<br>0.532 g, 5.31 mmol<br>0.592 g, 5.91 mmol | 2<br>2<br>2 | 1.116 g, 10.61 mmol<br>0.558 g, 5.31 mmol<br>0.601 g, 5.72 mmol | 22.11<br>11.33<br>10.68 |
| 18 | Mo—W—Nb—O | Molybdenum (V) ethoxide (1)<br>Tungsten (V) ethoxide (2)<br>Niobium (V) ethoxide (3) | 3.409 g (10.61 mmol)<br>2.173 g/1.98 ml (5.31 mmol)<br>2.287 g/2.08 ml (7.19 mmol) | —<br>0.532 g, 5.31 mmol<br>0.720 g, 7.19 mmol | 2<br>2<br>2 | 1.116 g, 10.61 mmol<br>0.558 g, 5.31 mmol<br>— | 22.11<br>11.33<br>11.68 |
| 19 | W—Nb—Ta—O | Tungsten (V) ethoxide (1)<br>Niobium (V) ethoxide (2)<br>Tantalum (V) ethoxide (3) | 2.494 g/2.27 ml (6.10 mmol)<br>3.944 g/3.58 ml (12.39 mmol)<br>2.322 g/2.11 ml (5.72 mmol) | 1.241 g, 12.40 mmol<br>0.592 g, 5.91 mmol | 2<br>2<br>2 | 0.641 g, 6.10 mmol<br>—<br>0.601 g, 5.72 mmol | 11.94<br>22.97<br>10.68 |
| 20 | Cr—V—Ta—O | Chromium (III) 2-ethylhexanoate 35% (1)<br>Vanadium triisopropoxide oxide (2)<br>Tantalum (V) ethoxide (3) | 6.924 g/6.29 ml (5.03 mmol)<br>1.340 g/1.22 ml (5.53 mmol)<br>2.154 g/1.96 ml (5.30 mmol) | 0.504 g, 5.03 mmol<br>0.554 g, 5.53 mmol<br>0.530 g, 5.29 mmol | 2<br>3<br>2 | 0.529 g, 5.03 mmol<br>—<br>0.557 g, 5.30 mmol | 11.12<br>11.51<br>11.29 |
| 21 | Mo—V—Ta—O | Molybdenum (V) ethoxide (1)<br>Vanadium triisopropoxide oxide (2)<br>Tantalum (V) ethoxide (3) | 1.749 g, (5.35 mmol)<br>1.343 g/1.22 ml (5.50 mmol)<br>4.577 g/4.16 ml (11.27 mmol) | —<br>0.553 g, 5.52 mmol<br>1.145 g, 11.44 mmol | 2<br>2<br>2 | 0.562 g, 5.35 mmol<br>—<br>1.185 g, 11.27 mmol | 10.37<br>10.08<br>21.22 |
| 22 | Mo—V—Nb—O | Molybdenum (V) ethoxide (1)<br>Vanadium triisopropoxide oxide (2)<br>Niobium (V) ethoxide (3) | 1.619 g, (5.04 mmol)<br>1.247 g/1.13 ml (5.15 mmol)<br>1.631 g/1.48 ml (5.13 mmol) | —<br>0.516 g, 5.15 mmol<br>— | 2<br>2<br>2 | 0.530 g, 5.04 mmol<br>—<br>0.539 g, 5.13 mmol | 10.53<br>10.52<br>10.66 |

TABLE 7-continued

Component solutions for Examples 11–29

| Example | Composition space | Components | | Acetylacetonate | Reflux time (hr) | Diethanolamine | Volume (ml) |
|---|---|---|---|---|---|---|---|
| 23 | W—V—Nb—O | Tungsten (V) ethoxide | 2.494 g/2.27 ml (6.10 mmol) (1) | — | 2 | 0.641 g, 6.10 mmol | 11.94 |
| | | Vanadium triisopropoxide oxide | 3.551 g/3.23 ml (14.67 mmol) (2) | 1.467 g, 14.65 mmol | 2 | — | 24.58 |
| | | Niobium (V) ethoxide | 3.944 g/3.58 ml (12.39 mmol) (3) | 1.241 g, 12.40 mmol | 2 | — | 22.97 |
| 24 | W—Cr—Nb—O | Tungsten (V) ethoxide | 2.494 g/2.27 ml (6.10 mmol) (1) | — | 2 | 0.641 g, 6.10 mmol | 11.94 |
| | | Chromium (III) 2-ethylhexanoate 35% | 6.924 g/6.29 ml (5.03 mmol) (2) | 0.504 g, 5.03 mmol | 2 | 0.529 g, 5.03 mmol | 11.12 |
| | | Niobium (V) ethoxide | 3.944 g/3.58 ml (12.39 mmol) (3) | 1.241 g, 12.40 mmol | 2 | — | 22.97 |
| 25 | Cr—Mo—Nb—O | Chromium (III) 2-ethylhexanoate 35% | 6.924 g/6.29 ml (5.03 mmol) (1) | 0.504 g, 5.03 mmol | 2 | 0.529 g, 5.03 mmol | 11.12 |
| | | Molybdenum (V) ethoxide | 3.409 g (10.61 mmol) (2) | — | 2 | 1.116 g, 10.61 mmol | 22.11 |
| | | Niobium (V) ethoxide | 3.944 g/3.58 ml (12.39 mmol) (3) | 1.241 g, 12.40 mmol | 2 | — | 22.97 |
| 26 | Cr—Mo—V—O | Chromium (III) 2-ethylhexanoate 35% | 6.924 g/6.29 ml (5.03 mmol) (1) | 0.504 g, 5.03 mmol | 2 | 0.529 g, 5.03 mmol | 11.12 |
| | | Molybdenum (V) ethoxide | 3.409 g (10.61 mmol) (2) | — | 2 | 1.116 g, 10.61 mmol | 22.11 |
| | | Vanadium triisopropoxide oxide | 3.551 g/3.23 ml (14.67 mmol) (3) | 1.467 g, 14.65 mmol | 2 | — | 24.58 |
| 27 | Mo—V—W—O | Molybdenum (V) ethoxide | 3.419 g (10.80 mmol) (1) | — | 2 | 1.136 g, 10.80 mmol | 20.07 |
| | | Vanadium triisopropoxide oxide | 3.551 g/3.23 ml (14.67 mmol) (2) | 1.467 g, 14.65 mmol | 2 | — | 24.58 |
| | | Tungsten (V) ethoxide | 2.494 g/2.27 ml (6.10 mmol) (3) | — | 2 | 0.641 g, 6.10 mmol | 11.94 |
| 28 | Cr—Mo—W—O | Chromium (III) 2-ethylhexanoate 35% | 6.924 g/6.29 ml (5.03 mmol) (1) | 0.504 g, 5.03 mmol | 2 | 0.529 g, 5.03 mmol | 11.12 |
| | | Molybdenum(V)ethoxide | 3.419 g (10.80 mmol) (2) | — | 2 | 1.136 g, 10.80 mmol | 20.07 |
| | | Tungsten (V) ethoxide | 2.494 g/2.27 ml (6.10 mmol) (3) | — | 2 | 0.641 g, 6.10 mmol | 11.94 |
| 29 | Cr—Mo—Ta—O | Chromium (III) 2-ethylhexanoate 35% | 6.924 g/6.29 ml (5.03 mmol) (1) | 0.504 g, 5.03 mmol | 2 | 0.529 g, 5.03 mmol | 11.12 |
| | | Molybdenum (V) ethoxide | 3.419 g (10.80 mmol) (2) | — | 2 | 1.136 g, 10.80 mmol | 20.07 |
| | | Tantalum (V) ethoxide | 2.322 g/2.11 ml (5.72 mmol) (3) | 0.592 g, 5.91 mmol | 2 | 0.601 g, 5.72 mmol | 10.68 |

Example 30

A focused examination of compositional space from example 22 is described. In this example, the compositional space of 50%≦Mo≦100%; 0≦V≦50%; 0≦Nb≦50% is examined.

Component 1 was prepared by the transfer of 3 ml of the molybdenum (V) ethoxide stock solution prepared in example 22. Ethylene glycol (0.45 ml) was added with stirring. Component 2 was prepared by the combination of 1.5 ml of the molybdenum (V) ethoxide stock solution from example 22 and 1.5 ml of the vanadium triisopropoxide oxide stock solution from example 22. Component 2 thus contains a solution that is 1 part molybdenum to 1 part vanadium. Ethylene glycol (0.45 ml) was added with stirring. Component 3 was prepared by the combination of 1.5 ml of the molybdenum (V) ethoxide solution from example 22 and 1.5 ml of the niobium (V) ethoxide solution from example 22. Component 3 thus contains a solution that is 1 part molybdenum to 1 part niobium. Ethylene glycol (0.45 ml) was added with stirring.

Using automated solution dispensing, components 1, 2 and 3 were dispensed into a microtiter plate with the purpose of preparing a triangular matrix. In this case, however, the regions at the apices of the triangular matrix contains solutions that are 100% molybdenum, 50% molybdenum-50% vanadium, and 50% molybdenum-50% niobium. Solutions were mixed and transferred to pretreated quartz wafers as described in example 10. Thermal processing was performed as described in example 10. Catalytic characterization was performed using scanning mass spectrometry and photothermal deflection, as described above. Catalytic performance qualities were seen to mimic those described in the literature (E. M. Thorsteinson et al., previously incorporated by reference).

Example 31

In a further examination of the composition space in example 22, a given region from within the matrix prepared in example 30 was doped with additional components. This example investigates the composition space Mo70% V25% (Nb1-xMx)5% where 0≦x≦1 and M=Fe, Co, Rh, Ni, Pd, Pt, Cu, Ag, Au, and Zn.

Component 1 was prepared by dissolving molybdenum (V) ethoxide (4.124 g, 12.84 mmol) in 2-methoxyethanol (~20 ml). The component solution was refluxed for 3 hours after which the solution was brought volumetrically to 25 ml with additional 2-methoxyethanol for a resulting concentration of 0.513 M. Component 2 was prepared by dissolving vanadium triisopropoxide oxide (3.208 g, 13.136 mmol) in 2-methoxyethanol (~20 ml). The component solution was refluxed for 3 hours after which the solution was brought volumetrically to 25 ml with additional 2-methoxyethanol resulting in a concentration of 0.525 M. Component 3 was prepared by dissolving niobium (V) ethoxide in 2 methoxyethanol (~8 ml). The component solution was refluxed for 3 hours after which the solution was brought volumetrically to 10 ml with additional 2-methoxyethanol resulting in a concentration of 0.546 M.

Components 4–13 were dissolved volumetrically in 5 ml methoxyethanol for a resulting concentration of 0.5 M unless otherwise noted (Table 8).

TABLE 8

Components 4–13 for example 31.

| Component | | Weight (g) | Concentration (M) |
|---|---|---|---|
| Iron (III) nitrate nonahydrate | (4) | 1.010 | 0.5 |
| Cobalt (III) nitrate hexahydrate | (5) | 0.728 | 0.5 |
| Rhodium (III) nitrate | (6) | 0.812 | 0.5 |
| Nickel (II) nitrate hexahydrate | (7) | 0.727 | 0.5 |
| Palladium (II) acetate trimer | (8) | 0.561 | 0.5 |
| Diammine platinum (II) nitrite solution | (9) | See text | 0.5 |
| Copper (II) nitrate hydrate | (10) | 0.469 | 0.5 |
| Silver nitrate | (11) | 0.385 | 0.5 |
| Gold (III) acetate | (12) | 0.468 | 0.25 |
| Zinc nitrate hexahydrate | (13) | 0.745 | 0.5 |

Component 14 was prepared by mixing component 1 (0.70 ml), component 2 (0.25 ml) and component 3 (0.05 ml). Component 15 was prepared by mixing component 1 (0.70 ml), component 2 (0.25 ml) and component 4 (0.05 ml). Component 16 was prepared by mixing component 1 (0.70 ml), component 2 (0.25 ml) and component 5 (0.05 ml). Component 17 was prepared by mixing component 1 (0.70 ml), component 2 (0.25 ml) and component 6 (0.05 ml). Component 18 was prepared by mixing component 1 (0.70 ml), component 2 (0.25 ml) and component 7 (0.05 ml). Component 19 was prepared by mixing component 1 (0.70 ml), component 2 (0.25 ml) and component 8 (0.05 ml). Component 20 was prepared by mixing component 1 (0.70 ml), component 2 (0.25 ml) and component 9 (0.287 g, 0.28 ml). Component 21 was prepared by mixing component 1 (0.70 ml), component 2 (0.25 ml) and component 10 (0.05 ml). Component 22 was prepared by mixing component 1 (0.70 ml), component 2 (0.25 ml) and component 11 (0.05 ml). Component 23 was prepared by mixing component 1 (0.70 ml), component 2 (0.25 ml) and component 12 (0.05 ml). Component 24 was prepared by mixing component 1 (0.70 ml), component 2 (0.25 ml) and component 13 (0.05 ml). Components 14–24 were used to prepare an 11×10 matrix in 2 microtiter plates. Component 14 was deposited into each microtiter well according to a compositional gradient such that the volume deposited equals [50−(column #−1)*5] µl for all 10 rows. Component 15–24 were deposited into rows 1–10, respectively, in an opposing compositional gradient such that the volume deposited equals [(column #−1)*5] µl. This gradient satisfies the formula Mo70% V25% (Nb1-xMx)5% for each well. Ratios of component 14 to 15–24 are represented in Table 1 for all rows. Solutions were mixed by agitation.

3 µl of each microtiter well were manually transferred to a pretreated quartz wafer. The wafer was allowed to gel under ambient conditions and was subsequently thermally processed using those parameters described in Example 10.

Example 32

In this example, a region of the composition space of Mo—V—Nb—W—Cr—Sb—Re—Mn—Ta—O is studied for compositions from A65B25C10 where A=Mo, W, Re; B=V, Cr, Mn; C=Nb, Sb, Ta.

Component solutions were prepared by dissolving Molybdenum (V) ethoxide (1.754 g, 5.38 mmol in 9.60 ml 2-methoxyethanol)(component 1), Vanadium triisopropoxide oxide (1.340 g/1.22 ml, 5.53 mmol in 9.72 ml 2-methoxyethanol) (component 2), Niobium (V) ethoxide (1.759 g/1.60 ml, 5.53 mmol in 8.50 ml 2-methoxyethanol)

(component 3), Rhenium (VII) oxide (2.161 g, 8.92 mmol in 11.90 ml 2-methoxyethanol) (component 4), Manganese (II) nitrate (1.097 g, 6.02 mmol in 10.32 ml 2-methoxyethanol) (component 5), Tantalum (V) ethoxide (2.154 g/1.960 ml, 5.30 mmol in 8.28 ml 2-methoxyethanol)(component 6), Tungsten (V) ethoxide (2.052 g/ 1.87 ml, 5.02 mmol in 8.34 ml 2-methoxyethanol)(component 7), Chromium (III) 2-ethylhexanoate 35% (6.924 g/6.29 ml, 5.03 mmol in 3.83 ml 2-methoxyethanol) (component 8), and Antimony (III) n-butoxide (2.028 g/1.85 ml, 5.95 mmol in 9.30 ml 2-methoxyethanol) (component 9) in 2-methoxyethanol. Acetylacetonate (0.539 g, 5.38 mmol; 0.554 g, 5.53 mmol; 0.562 g, 5.61 mmol; 0.723 g, 7.22 mmol; 0.602 g, 6.02 mmol; 0.530 g, 5.29 mmol; 0.538 g, 5.37 mmol; 0.504 g, 5.03 mmol) was added to components 1–8 with stirring.

Components 1, 5, 8 and 9 were refluxed for 2 hours and components 2, 3, 6 and 7 were refluxed for 3 hours under an atmosphere of argon. Component 4 was not refluxed.

To 3 ml of component 1, diethanolamine (0.566 g, 5.38 mmol), 2-methoxyethanol (0.38 ml) and ethylene glycol (0.45 ml) were added with stirring. To 3 ml of component 2,2-methoxyethanol (0.22 ml), and ethylene glycol (0.45 ml) were added with stirring. To 3 ml of component 3, diethanolamine (1.163 g, 11.06 mmol), 2-methoxyethanol (0.33 ml) and ethylene glycol (0.45 ml) were added with stirring. To 3 ml of component 4, diethanolamine (0.938 g, 8.92 mmol), 2-methoxyethanol (1.44 ml) and ethylene glycol (0.45 ml) were added with stirring. To 3 ml of component 5, diethanolamine (0.633 g, 6.02 mmol), 2-methoxyethanol (0.51 ml) and ethylene glycol (0.45 ml) were added with stirring. To 3 ml of component 6, diethanolamine (0.557 g, 5.30 mmol), 2-methoxyethanol (0.15 ml) and ethylene glycol (0.45 ml) were added with stirring. To 3 ml of component 7, diethanolamine (0.528 g, 5.02 mmol) and ethylene glycol (0.45 ml) were added with stirring. To 3 ml of component 8, diethanolamine (0.529 g, 5.03 mmol), 2-methoxyethanol (0.03 ml) and ethylene glycol (0.45 ml) were added with stirring. To 3 ml of component 9, diethanolamine (0.626 g, 5.95 mmol), 2-methoxyethanol (0.41 ml) and ethylene glycol (0.45 ml) were added with stirring.

Component 10 was prepared by mixing component 1 (2.60 ml), component 2 (1.00 ml) and component 3 (0.40 ml) with stirring for a resulting metal ratio of Mo65:V25:Nb10. Component 11 was prepared by mixing component 4 (2.60 ml), component 5 (1.00 ml) and component 6 (0.40 ml) with stirring for a resulting metal ratio of Re65:Mn25:Ta10. Component 12 was prepared by mixing component 7 (2.60 ml), component 8 (1.00 ml) and component 9 (0.40 ml) with stirring for a resulting metal ratio of W65:Cr25:Sb10.

Using automated solution dispensing, volumes of each component were dispensed into a 96-well microtiter plate in ratios such that a total of 50 µl of component solutions were present in each of 66 wells for the purpose of creating an 11×11×11 triangular matrix of Mo65:V25:Nb10-Re65:Mn25:Ta10-W65:Cr25:Sb10-O. Components 10, 11, and 12 were deposited into each of the 66 wells using the compositional gradient illustrated in Table 2. At each apex, 50 µl of components 10, 11, and 12 were deposited, respectively. Depositions of each component solution (10, 11, and 12) were decremented in units of 10%, i.e. 5 µl, from each apex resulting in compositional variation from 100–0% for each component solution while maintaining a total volume of 50 µl of solution per well. The percent of the 50 µl in each well attributable to components 10, 11, and 12, respectively, are listed in Table 2. To ensure adequate mixing, solutions were agitated with a stream of $N_2$.

From each microtiter region, 3 µl were transferred to each region on the silicon substrate such that a triangular array was repeated on the quartz wafer. A redundant triangular array was also prepared on the quartz wafer such that each array could be superimposed after a 180° rotation. The quartz substrates were prepared in an analogous fashion to the silicon substrates described in example 1. The substrate was covered and allowed to dry under ambient conditions overnight. Thermal processing of the resulting library took place in air. The sample was heated from room temperature at a rate of 1° C./min. to 120° C. and maintained at that temperature for 2 hours followed by heating at 1° C./min. to 180° C., holding for 2 hours then heated at 1° C./min to 400° C., held for 8 hours after which the substrate is cooled to room temperature at the natural cooling rate of the furnace.

Example 33

The following is an example of a 4×11 array where the following compositional variations in the matrix $Zn_2(Si_{1-x}Ge_x)O_4$ doped with Mn, Co and Cu are explored. The array is deposited on a modified thick film dielectric substrate using ink jet dispensing.

Zinc acetate (0.621 g ; $2.82 \times 10^{-3}$ mol) and diethanolamine (0.297 g ; $2.82 \times 10^{-3}$ mol) was heated in 2-methoxyethanol (10.27 ml) at 100° C. for 1 hour. Stock solutions containing germanium and silicon were prepared by refluxing the corresponding tetraethoxides in 2-methoxyethanol in a manner similar to that described for the stock solutions in example 1.

The components were prepared from the stock solutions:
Component 1—zinc acetate ($8.25 \times 10^{-4}$ mol) and diethanolamine ($8.25 \times 10^{-4}$ mol) in 2-methoxyethanol (total vol=3.3 ml) and ethylene glycol (0.33 ml);
Component 2—germanium tetraethoxide ($1.04 \times 10^{-3}$ mol) in 2-methoxyethanol (total vol=4.16 ml) and ethylene glycol (0.416 ml);
Component 3—silicon tetraethoxide ($8.48 \times 10^{-4}$ mol) in water (10% v/v)/2-methoxyethanol (total vol=3.392 ml) and ethylene glycol (0.339 ml);
Component 4—component 1 (1.0 ml) and component 3 (0.5 ml) giving a solution that contains 2 parts Zn to 1 part Si;
Component 5—component 1 (1.0 ml) and component 2 (0.5 ml) giving a solution that contains 2 parts Zn to 1 part Ge;
Component 6—manganese (II) acetate tetrahydrate (0.061 g, $2.5 \times 10^{-4}$ mol) in 2-methoxyethanol (1.0 ml);
Component 7—cobalt (II) acetate tetrahydrate (0.062 g, $2.5 \times 10^{-4}$ mol) in 2-methoxyethanol (1.0 ml); and
Component 8—copper (II) acetate monohydrate (0.049 g, $2.5 \times 10^{-4}$ mol) in water (1.0 ml).

On a standard microtiter plate 4 identical rows of 11 regions per row are created from dispensing gradients of components 4 and 5 using automated solution dispensing such that the volumetric ratios of 4:5 are identical to that shown in Table 1 for components A:B. The total volume in each region is constant and=50 µl. This corresponds to the nominal stoichiometry of $Zn_2(Si_{1-x}Ge_x)$ for x=0 to 1.0 in increments of 0.1 for each row.

Using an inkjet dispenser, 333 nanoliters (nl) from component 8 is deposited into each of 11 regions in row 2. The same dispensing is used for component 7 in each region in row 3. The same dispensing parameters is used for component 6 in row 4. This corresponds to a doping level of approximately 1.1% of Cu, Co and Mn w.r.t. Zn. Mixing of all the components in each region is accomplished by agitation with a stream of nitrogen gas.

A barium titanate (2"×1") thick film dielectric substrate was modified on one side by depositing a thin layer (900 Å)

of SiO$_2$ using r.f. sputtering. The substrate was further treated by exposure to a vapor of dichlorodimethylsilane contained in a closed vessel for 15 minutes. The substrate was then washed with methylene chloride and dried for 15 minutes in an oven at 100° C. The 4×11 array from the microtiter plate is recreated on the modified barium titanate substrate by depositing 60 nl from each region of the microtiter plate to a region on the substrate such that the center to center spacing between each region in a row was 2.0 mm and the spacing between rows was 3.0 mm. After allowing drying for 30 minutes the area of each region was approximately 0.5 mm diameter. The array was processed in a box furnace in air from room temperature to 180° C. at a heating rate of 1° C./min and holding for 1 hour at that temperature followed by heating to 500° C. at 3° C./min and holding for 4 hours followed by heating to 900° C. at 5° C./min and maintaining the temperature for 4 hours then cooled to room temperature.

Only row 4, which contained Mn, showed photoluminescence (green) when irradiated with shortwave length (254 nm) ultraviolet light. A gradient of luminesence intensity was evident in row 4 and increased from the silicon rich regions to the regions corresponding approximately to equal ratios of Si:Ge then decreased in intensity in the germanium rich regions.

It is to be understood that the above description is intended to be illustrative and not restrictive. Many embodiments will be apparent to those of skill in the art upon reading the above description. The scope of the invention should, therefore, be determined not with reference to the above description, but should instead be determined with reference to the appended claims, along with the full scope of equivalents to which such claims are entitled. The disclosures of all articles and references, including patent applications and publications, are incorporated herein by reference for all purposes.

What is claimed is:

1. A method for creating and screening libraries of materials, the method comprising:
   i) preparing a first library comprising a first array of materials on a common first substrate, the first array including compositional gradients having a predefined step size within a ternary space of components, the first array being formed by a method that comprises:
      (a) at least partially dissolving two or more components;
      (b) mixing the two or more components together in nine or more different ratios thereby forming nine or more different mixtures; and
      (c) dispensing the two or more components in nine or more different ratios into regions on the first substrate; and
   ii) screening the materials of the first library for heterogeneous catalysis performance, and
   iii) preparing a second library based on the result(s) of the screening step (ii) to evaluate whether local performance maxima exist at compositions between those of the first array, the second library being a focus library and comprising a second array of materials on a second common substrate, the second array including compositional gradients having a predefined step size within the ternary space of components where the gradient step size of the second array is smaller than the gradient step size of the first array, the second array being formed by a method that comprises:
      (a) at least partially dissolving two or more components;
      (b) mixing the two or more components together in nine or more different ratios thereby forming nine or more different mixtures; and
      (c) dispensing the two or more components in nine or more different ratios into regions on a second substrate.

2. The method of claim 1, further comprising heat treating at least one of the first or second common substrates comprising the nine or more different mixtures to form the first array.

3. The method of claim 1, wherein mixing occurs during dispensing.

4. The method of claim 2, further comprising heat treating the second common substrate comprising the nine or more different mixtures to form the second array.

5. The method of claim 2, wherein the components are dispensed in a sol-gel.

6. The method of claim 5, further comprising screening the first array by performing x-ray diffraction analysis of the materials in the array.

7. The method of claim 2, further comprising testing the second array for heterogeneous catalysis performance.

8. The method of claim 7, further comprising preparing a bulk catalyst.

9. A method for creating and screening libraries of materials, the method comprising:.
   i) preparing a first library comprising a first array of materials on a common first substrate, the first array including compositional gradients having a predefined step size within a ternary space of components, the first array being formed by a method that comprises:
      (a) at least partially dissolving two or more components;
      (b) mixing with an automated dispensing robot the two or more components together in nine or more different ratios thereby forming nine or more different mixtures in a first microtiter plate; and
      (c) dispensing the two or more components in nine or more different ratios from the microtiter plate into regions on a first wafer substrate;
      (d) thermally processing the resulting first array; and
   ii) screening the materials of the first library for a useful property, and
   iii) preparing a second library based on the result(s) of the screening step (ii) to evaluate whether local performance maxima exist at compositions between those of the first array, the second library being a focus library and comprising a second array of materials on a second common substrate, the second array including compositional gradients having a predefined step size within the ternary space of components where the gradient step size of the second array is smaller than the gradient step size of the first array, the second array being formed by a method that comprises:
      (a) at least partially dissolving two or more components;
      (b) mixing the two or more components together in nine or more different ratios thereby forming nine or more different mixtures within the range of compositions on the first wafer substrate;
      (c) dispensing the two or more components in nine or more different ratios into regions on the second common substrate;
      (d) thermally processing the resulting second array;
      (e) characterizing catalytic properties of the materials from the second common substrate; and
      (f) outputting data from step (e).

10. The method of claim 9, wherein the first and second resulting arrays include transition metal oxides.

11. The method of claim 9, wherein the step of characterizing the materials on the second common substrate includes performing a scanning mass spectrometry analysis.

12. The method of claim 9, wherein the step of characterizing the materials on the second common substrate includes performing a photothermal deflection analysis.

13. The method of claim 10, wherein the step of characterizing the materials on the second common substrate includes performing a scanning mass spectrometry analysis and performing a photothermal deflection analysis.

14. The method of claim 9, further comprising preparing a third array on a third common substrate wherein certain of the materials of the second array are doped with additional components.

15. The method of claim 9 wherein the nine or more different ratios dispensed on the first wafer substrate vary in decrements of 10%.

16. A method for creating and screening libraries of materials, the method comprising:
  i) preparing a first library comprising a first array of materials on a common first substrate, the first array including compositional gradients having a predefined step size within a ternary space of three components, the first array being formed by a method that comprises:
   (a) preparing three different metal alkoxide solutions;
   (b) dispensing each of the different metal alkoxide solutions into a first common substrate for forming a triangular array having individual metal alkoxide solutions in the wells mapped to each apex of the triangle, binary metal alkoxide solutions along the sides, and ternary mixtures within the interior of the triangle;
   (c) recreating the array on a second common substrate by transferring the solutions from the first common substrate to the second common substrate;
   (d) thermally processing the array of step (c);
   (e) screening the materials of the first library for a catalytic property;
   (f) preparing a second library from within the compositional regions of the array of step (c) shown to have the highest % yield, the second library being a focused library and including a smaller step size compositional gradient;
   (g) characterizing the catalytic properties of the materials from the second focused library; and
   (h) preparing a bulk catalyst material having a composition from the second focused library.

17. The method of claim 16, wherein the screening step (e) includes performing a scanning mass spectrometry analysis.

18. The method of claim 17, wherein the screening step (e) includes performing a photothermal deflection analysis.

19. The method of claim 16, wherein the thermally processing step includes a step of calcining the array.

20. The method of claim 17, wherein the screening step (e) is the oxidative dehydrogenation of light paraffins for determining the catalytic property.

* * * * *